US007742907B2

(12) United States Patent
Gupta et al.

(10) Patent No.: US 7,742,907 B2
(45) Date of Patent: Jun. 22, 2010

(54) ITERATIVE ABSTRACTION USING SAT-BASED BMC WITH PROOF ANALYSIS

(75) Inventors: Aarti Gupta, Princeton, NJ (US); Malay Ganai, Plainsboro, NJ (US); Zijiang Yang, Plainsboro, NJ (US); Pranav Ashar, Belle Mead, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 842 days.

(21) Appl. No.: 10/762,499

(22) Filed: Jan. 23, 2004

(65) Prior Publication Data
US 2004/0230407 A1   Nov. 18, 2004

Related U.S. Application Data

(60) Provisional application No. 60/463,088, filed on Apr. 15, 2003.

(51) Int. Cl.
G06F 17/50 (2006.01)
G06F 9/45 (2006.01)
(52) U.S. Cl. ............................................. 703/14; 716/5
(58) Field of Classification Search .................... 716/5; 703/14
See application file for complete search history.

(56) References Cited

U.S. PATENT DOCUMENTS 6,643,827 B1 * 11/2003 Yang .............................. 716/2
6,848,088 B1 * 1/2005 Levitt et al. ................... 716/4
6,944,838 B2 * 9/2005 McMillan ...................... 716/5
7,406,405 B2 * 7/2008 McMillan et al. ............ 703/2
2004/0019468 A1 * 1/2004 De Moura et al. ........... 703/2

OTHER PUBLICATIONS

J. Baumgartner, A. Kuehlmann, and J. Abraham; Property Checking via Structural Analysis; Proceedings of Computer Aided Verification, Jul. 27-31, 2002; pp. 1-13.*
J. P. Marques-Silva and K. A. Sakallah, "GRASP: A Search Algorithm for Propositional Satisfiability," IEEE Transactions on Computers, vol. 48, pp. 506-521, 1999.*
M. Ganai and A. Aziz, "Improved SAT-based Bounded Reachability Analysis," in Proceedings of VLSI Design Conference, Jan. 7, 2002-Jan. 11, 2002, pp. 729-734.*
Lintao Zhang, et al.; Validating SAT Solvers Using an Independent Resolution-Based Chekcer: Practical Implementations and Other Applications; Design, Automation, and Test in Europe, Proceedings of the conference on Design, Automation, and Test in Europe vol. 1; 2003, ISBN~ISSN:1530-1591, 0-7695-1870-2, pp. 6, IEEE Computer Society, Washington, DC, USA.
Kenneth L. McMillan et al.; Automatic Abstraction without Counterexamples; Cadence Design Systems; H. Garavel and J. Hatcliff (Eds.): TACAS 2003; LNCS 2619; 2003; pp. 2-17.

* cited by examiner

Primary Examiner—Paul L Rodriguez
Assistant Examiner—Juan C Ochoa
(74) Attorney, Agent, or Firm—Joseph J. Kolodka

(57) ABSTRACT

A method of obtaining a resolution-based proof of unsatisfiability using a SAT procedure for a hybrid Boolean constraint problem comprising representing constraints as a combination of clauses and interconnected gates. The proof is obtained as a combination of clauses, circuit gates and gate connectivity constraints sufficient for unsatisfiability.

7 Claims, 15 Drawing Sheets

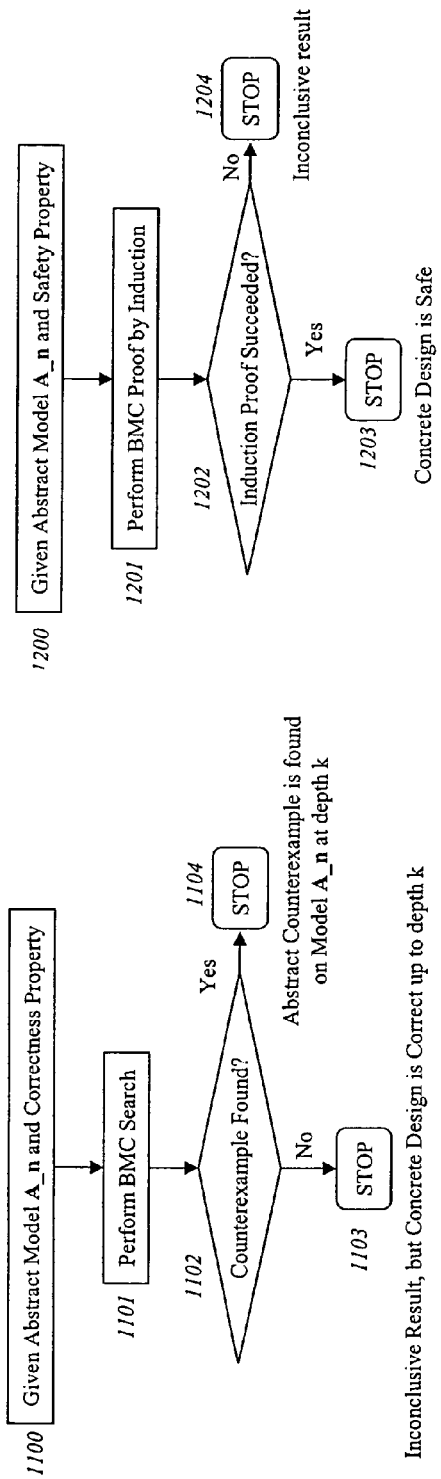
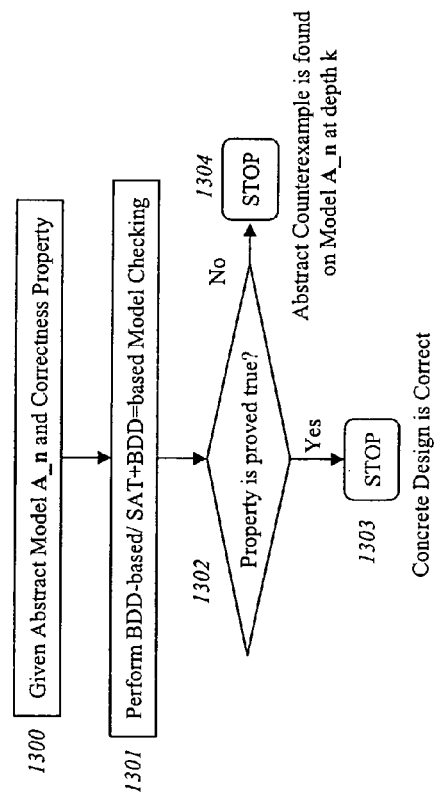
FIG.11
FIG.12
FIG.13

Clauses:
C1: $x1' + x2 + x6$
C2: $x2 + x3 + x7'$
C3: $x3 + x4' + x8$
C4: $x1' + x6' + x5'$
C5: $x6' + x7 + x8' + x9'$
C6: $x5 + x9 + x10$
C7: $x9 + x10'$ Conflict Clause C8:
$x1' + x2 + x3 + x8'$
Due to conflict $(x10, x10')$ Antecedents(C8) =
{C7, C6, C5, C4, C2, C1}

```
rec_dfs_through_marked_nodes(node n) {
   if (visited(n)) return;
   if (!marked(n)) return;
   visited(n)=1;
   for each m in fanin(n) {
     rec_dfs_through_marked(m);
   }}
```

FIG. 16

ITERATIVE ABSTRACTION USING SAT-BASED BMC WITH PROOF ANALYSIS

A. RELATED APPLICATIONS

This Application claims priority from co-pending U.S. Provisional Application Ser. No. 60/463,088 filed Apr. 15, 2003, the contents of which are incorporated herein by reference.

B. FIELD

This disclosure teaches techniques related to resolution-based proof analysis techniques for Boolean Satisfiability (SAT) solvers, which are used to generate a set of useful constraints from a given unsatisfiable problem. Uses of the Resolution-based proof analysis techniques with SAT-based Bounded Model Checking (BMC) on a given concrete design in order to generate conservative abstract models are also discussed. Uses for these abstract models and resolution-based proof analysis techniques with SAT-based and BDD-based model checking methods are also taught.

C. BACKGROUND

1. References

The following papers provide useful background information, for which they are incorporated herein by reference in their entirety, and are selectively referred to in the remainder of this disclosure by their accompanying reference numbers in square brackets (i.e., [3] for the third numbered paper by R. E. Bryant):

[1] E. M. Clarke, O. Grumberg, and D. Peled, Model Checking: MIT Press, 1999.

[2] K. L. McMillan, Symbolic Model Checking: An Approach to the State Explosion Problem: Kluwer Academic Publishers, 1993.

[3] R. E. Bryant, "Graph-based algorithms for Boolean function manipulation," IEEE Transactions on Computers, vol. C-35(8), pp. 677-691, 1986.

[4] A. Biere, A. Cimatti, E. M. Clarke, and Y. Zhu, "Symbolic Model Checking without BDDs," in Proceedings of Workshop on Tools and Algorithms for Analysis and Construction of Systems (TACAS), vol. 1579, LNCS, 1999.

[5] M. Sheeran, S. Singh, and G. Stalmarck, "Checking Safety Properties using Induction and a SAT Solver," in Proceedings of Conference on Formal Methods in Computer-Aided Design, 2000.

[6] J. P. Marques-Silva and K. A. Sakallah, "GRASP: A Search Algorithm for Propositional Satisfiability," IEEE Transactions on Computers, vol. 48, pp. 506-521, 1999.

[7] M. Moskewicz, C. Madigan, Y. Zhao, L. Zhang, and S. Malik, "Chaff: Engineering an Efficient SAT Solver," in Proceedings of Design Automation Conference, 2001.

[8] E. Goldberg and Y. Novikov, "BerkMin: A Fast and Robust SAT-Solver," in Proceedings of Conference on Design Automation & Test Europe (DATE), 2002, pp. 142-149.

[9] M. Ganai, L. Zhang, P. Ashar, and A. Gupta, "Combining Strengths of Circuit-based and CNF-based Algorithms for a High Performance SAT Solver," in Proceedings of the Design Automation Conference, 2002.

[10] L. Zhang and S. Malik, "Validating SAT Solvers Using an Independent Resolution-Based Checker: Practical Implementations and Other Applications," in Proceedings of Conference on Design Automation & Test Europe (DATE), 2003.

[11] E. Goldberg and Y. Novikov, "Verification of Proofs of Unsatisfiability for CNF Formulas," in Proceedings of Conference on Design Automation &Test Europe (DATE), 2003.

[12] P. Chauhan, E. M. Clarke, J. Kukula, S. Sapra, H. Veith, and D. Wang, "Automated Abstraction Refinement for Model Checking Large State Spaces using SAT based Conflict Analysis," in Proceedings of Conference on Formal Methods in CAD (FMCAD), 2002.

[13] K. L. McMillan and N. Amla, "Automatic Abstraction Without Counterexamples," in Proceedings of Tools for Algorithms for Construction and Analysis of Systems (TACAS), 2003.

[14] A. Kuehlmann, M. Ganai, and V. Paruthi, "Circuit-based Boolean Reasoning," in Proceedings of Design Automation Conference, 2001.

[15] E. M. Clarke, O. Grumberg, and D. E. Long, "Model Checking and Abstraction," in Proceedings of Conference on Principles of Programming Languages, 1992.

[16] A. Gupta, M. Ganai, C. Wang, Z. Yang, and P. Ashar, "Abstraction and BDDs Complement SAT-based BMC in DiVer," in Proceedings of International Conference on Computer Aided Verification, vol. 2725, LNCS, 2003.

[17] R. P. Kurshan, Computer-Aided Verification of Coordinating Processes: The Automata-Theoretic Approach: Princeton University Press, 1994.

[18] E. M. Clarke, O. Grumberg, S. Jha, Y. Lu, and H. Veith, "Counterexample-guided abstraction refinement," in Proceedings of Conference on Computer Aided Verification, vol. 1855, LNCS, 2000, pp. 154-169.

[19] D. Wang, P.-H. Ho, J. Long, I. Kukula, Y. Zhu, H. Keung, T. Ma, and R. Damiano, "Formal Property Verification by Abstraction Refinement with formal, simulation, and hybrid engines," in Proceedings of Design Automation Conference, 2001.

[20] E. M. Clarke, A. Gupta, J. Kukula, and O. Strichman, "SAT based abstraction-refinement using ILP and machine learning techniques," in Proceedings of Conference on Computer Aided Verification, 2002.

[21] R. Majumdar, T. A. Henzinger, R. Jhala, and G. Sutre, "Lazy Abstraction," in Proceedings of Conference on Principles of Programming Languages, 2002.

[22] K. L. McMillan, "Interpolation and SAT-based Model Checking," in Proceedings of Conference on Computer-Aided Verification, vol. 2725, LNCS, 2003.

[23] M. Davis and H. Putnam, "A Computing Procedure for Quantification Theory," Journal of ACM, vol. 7, pp. 201-214, 1960.

[24] L. Zhang, C. Madigan, M. Moskewicz, and S. Malik, "Efficient Conflict Driven Learning in a Boolean Satisfiability Solver," in Proceedings of the International Conference on Computer-Aided Design, 2001.

[25] A. Gupta, Z. Yang, P. Ashar, L. Zhang, and S. Malik, "Partition-Based Decision Heuristics for Image Computation using SAT and BDDs," in Proceedings of International Conference on Computer-Aided Design, 2001.

2. Introduction

Symbolic model checking techniques [1,2], based on the use of Binary Decision Diagrams (BDDs), offer the potential of exhaustive coverage and the ability to detect subtle bugs. However, these techniques do not scale very well in practice due to the state explosion problem. A recent alternative is Bounded Model Checking (BMC)[4], which focuses on the search for counterexamples of bounded depth. Effectively, the problem is translated to a propositional formula, such that the formula is satisfiable if and only if there exists a counter-example of depth k. In practice, the depth k can be increased incrementally to find the shortest counterexample. However, additional reasoning is needed to ensure completeness of the proof of correctness, when no counterexample can be found [4,5].

The satisfiability check in the BMC method is typically performed by a backend SAT solver. Due to the many advances in SAT solving techniques [6-9], BMC can handle much larger designs than BDD-based methods. A related important development has been the use of resolution-based proof analysis techniques to check the unsatisfiability result of a SAT solver [10,11]. As part of the check, these techniques also identify a set of clauses from the original problem, called the unsatisfiable core, such that the clauses are sufficient for implying the unsatisfiability.

Similar SAT-based proof analysis techniques have also been proposed independently in the context of refinement, and abstraction-based verification methods [12,13]. The existing resolution-based proof analysis techniques have been described for SAT solvers that use a CNF (Conjunctive Normal Form) representation of the Boolean problem.

D. RELATED WORK

The present teachings are broadly related to the many efforts in verification that use abstraction and refinement [12, 17-20]. Most of these efforts are bottom-up approaches, where starting from a small abstract model of the concrete design, counterexamples found on these models are used to refine them iteratively. In practice, many iterations are needed before converging on a model where the proof succeeds. More frequently, the size of the refined abstract model grows monotonically larger, on which unbounded verification methods fail to complete.

Popularity of the bottom-up approaches are due to a lack of techniques that could extract relevant information from a relatively large concrete design. This is changing now with the use of proof analysis techniques for SAT solvers and other theorem-provers, and use of interpolants that approximate reachable state sets [22].

SUMMARY

To overcome some of the disadvantages noted below and secure some of the advantages noted above, there is a method of obtaining a resolution-based proof of unsatisfiability using a SAT procedure for a hybrid Boolean constraint problem comprising representing constraints as a combination of clauses and interconnected gates. The proof is obtained as a combination of clauses, circuit gates and gate connectivity constraints sufficient for unsatisfiability.

Another aspect of the disclosed teachings is a method for determining an abstract model of an original circuit, comprising marking constraints for unsatisfiability at decision level 0. Only a subset of the marked constraints in step a is kept, the subset being in a transitive fanin of all marked constraints that are external. A revised circuit formed from the subset is designated as the abstract model.

Yet another aspect of the disclosed teachings is a method for determining an abstract sequential circuit model of an original sequential circuit model, comprising adding to the original sequential circuit model, interface propagation constraints to capture equality between an input and output of a flip-flop across successive time frames, and an initial value constraint for each flip-flop. Constraints required for unsatisfiability of external constraints across multiple cycles of operation of the sequential circuit are marked. The abstract sequential circuit is formed by including combinational fanin cones of marked external constraints and flip-flops corresponding to the marked interface constraints.

Still another aspect of the disclosed teachings is method for determining an abstract sequential circuit model of an original sequential circuit model, comprising adding to the original circuit model, interface propagation constraints for each flip-flop to capture equality between an input and output of a flip-flop across successive time frames, and an initial value constraint for each flip-flop. Constraints required for unsatisfiability of external constraints across multiple cycles of operation of the sequential circuit are marked. The abstract sequential circuit is formed by including combinational fanin cones of marked external constraints and flip-flops corresponding to marked interface propagation constraints only, and by adding constraints for initial values of flip-flops with marked initial value constraint only.

Still another aspect of the disclosed teachings is a method for determining an abstract sequential circuit model of an original sequential circuit model, comprising adding to the original sequential circuit model, interface propagation constraints for each flip-flop to capture equality between an input and output of a flip-flop across successive time frames), and an initial value constraint for each flip-flop. Constraints required for unsatisfiability of external constraints across multiple cycles of operation of the sequential circuit are marked. The abstract sequential circuit is formed by including combinational fanin cones of marked external constraints and flip-flops corresponding to marked interface propagation constraints only, and by adding lazy constraints for initial values of flip-flops with marked initial value constraint only.

Still another aspect of the disclosed teaching is a method for determining an abstract model of an original circuit, comprising adding external constraints to the original circuit model based on a need to check temporal properties of the original circuit, and for enforcing environment constraints. Constraints for unsatisfiability are marked at decision level 0. Only a subset of the marked constraints are kept, said subset being in a transitive fanin of all marked constraints that are external. A revised circuit formed from the subset identified is designated as the abstract model.

Still another aspect of the disclosed teachings is a method for determining an abstract sequential circuit model of an original sequential circuit model, comprising adding external constraints to the original circuit model based on a need to check temporal properties of the original circuit and for enforcing environment constraints. Interface constraints are added to the original sequential circuit model to capture equality between an input and output of a flip-flop across successive time frames, including its initial value constraint at depth. Constraints for unsatisfiability of external constraints across multiple cycles of operation of the sequential circuit are marked. The abstract sequential circuit is generated by including combinational fanin cones of marked external constraints and flip-flops corresponding to only the marked interface constraints.

Still another aspect of the disclosed teachings is an iterative abstraction method for obtaining an abstract model for verifying a design of a circuit, comprising receiving a concrete design of the circuit. A correctness property is received. The concrete design is assigned as an nth-abstract model, where n=1. A bounded model checking is performed with resolution-based proof analysis on n-th abstract model. An (n+1)th-abstract model is obtained. The procedure is stopped if further abstraction is not necessary based on a criteria. Otherwise n is set to n+1 and the bounded model checking is continued.

Still another aspect of the disclosed teachings is a method of refining an abstract model comprising adding interface constraints to a sequential circuit model to capture equality between an input and output of a flip-flop across successive time frames. Boolean constraints are generated for a counterexample on the abstract model separately for each time frame up to depth d of the counterexample. K is assigned to 1. A SAT problem is formulated for checking constraints at depth k. A SAT solver with resolution-based proof analysis is used to determine if the SAT problem is satisfiable. K is set to k+1 if the SAT problem is satisfiable. If k does not exceed d the procedure is continued by formulating a new SAT problem. The procedure is stopped if k exceeds d. The abstract model is refined using marked constraints for unsatisfiability at depth k if the problem is not satisfiable.

Still another aspect of the disclosed teachings is a method of verifying correctness of a model of a circuit comprising: obtaining an abstract model by using iterative abstraction. A correctness property is obtained. Bounded model checking on the abstract model. It is concludes that a counterexample does not exist at depth k for the circuit if no counterexample exists at depth k for the abstract model. It is concluded that the circuit is correct up to depth k if no counterexample exists.

Still another aspect of the disclosed teachings is a method of performing proof by induction on a circuit comprising obtaining an abstract model of the circuit by using iterative abstraction. A safety property is obtained. Proof by induction is performed using bounded model checking approach on the abstract model. It is concluded that the proof by induction succeeds on the original circuit if the proof succeeds with the abstract model.

Still another aspect of the disclosed teachings is a method of performing a symbolic model checking for a circuit using a BDD based approach comprising obtaining an abstract model of the circuit by using iterative abstraction. A correctness property is generated. BDD-based symbolic model checking is performed on the abstract model. It is concluded that the correctness property is proven true on the circuit if the correctness property is proven true in the abstract model.

Still another aspect of the disclosed teachings is a method of performing a symbolic model checking of a circuit using a hybrid SAT and BDD based approach comprising obtaining an abstract model of the circuit by using iterative abstraction. A correctness property is obtained. A hybrid SAT and BDD-based symbolic model checking is performed on the abstract model. It is concluded that the correctness property is proven true on the circuit if the correctness property is proven true in the abstract model.

Still another aspect of the disclosed teachings is a method of performing verification of a circuit comprising obtaining an abstract model of the circuit by using iterative abstraction. A BDD-based reachability analysis on the abstract model is performed on the circuit. BDDs corresponding to reachable sets are added as Boolean constraints in the circuit model. Bounded model checking proof by induction is performed on the circuit model. It is concluding that the circuit is safe if the proof succeeds Still another aspect of the disclosed teachings is a method of performing verification of a circuit comprising obtaining an abstract model of the circuit by using iterative abstraction. A correctness property is obtained. A BDD-based reachability analysis is performed on the abstract model. BDDs corresponding to reachable sets are added as Boolean constraints in the circuit model. bounded model checking search is performed on the circuit model. It is concluded that the circuit is safe up to depth k if no counterexample is found.

BRIEF DESCRIPTION OF THE DRAWINGS

The disclosed teachings are discussed below in detail by way of various specific exemplary implementations, and illustrated in the enclosed drawing figures.

FIG. 11 is a block/flow diagram illustrating a BMC search technique to search for a counterexample on an abstract model.

FIG. 12 is a block/flow diagram illustrating a BMC proof technique.

FIG. 13 is a block/flow diagram illustrating a BDD-based/BDD+SAT-based model checking method.

FIG. 16 shows an example pseudocode for a recursive DFS through marked nodes.

DETAILED DESCRIPTION

A. Synopsis

Figure 1:
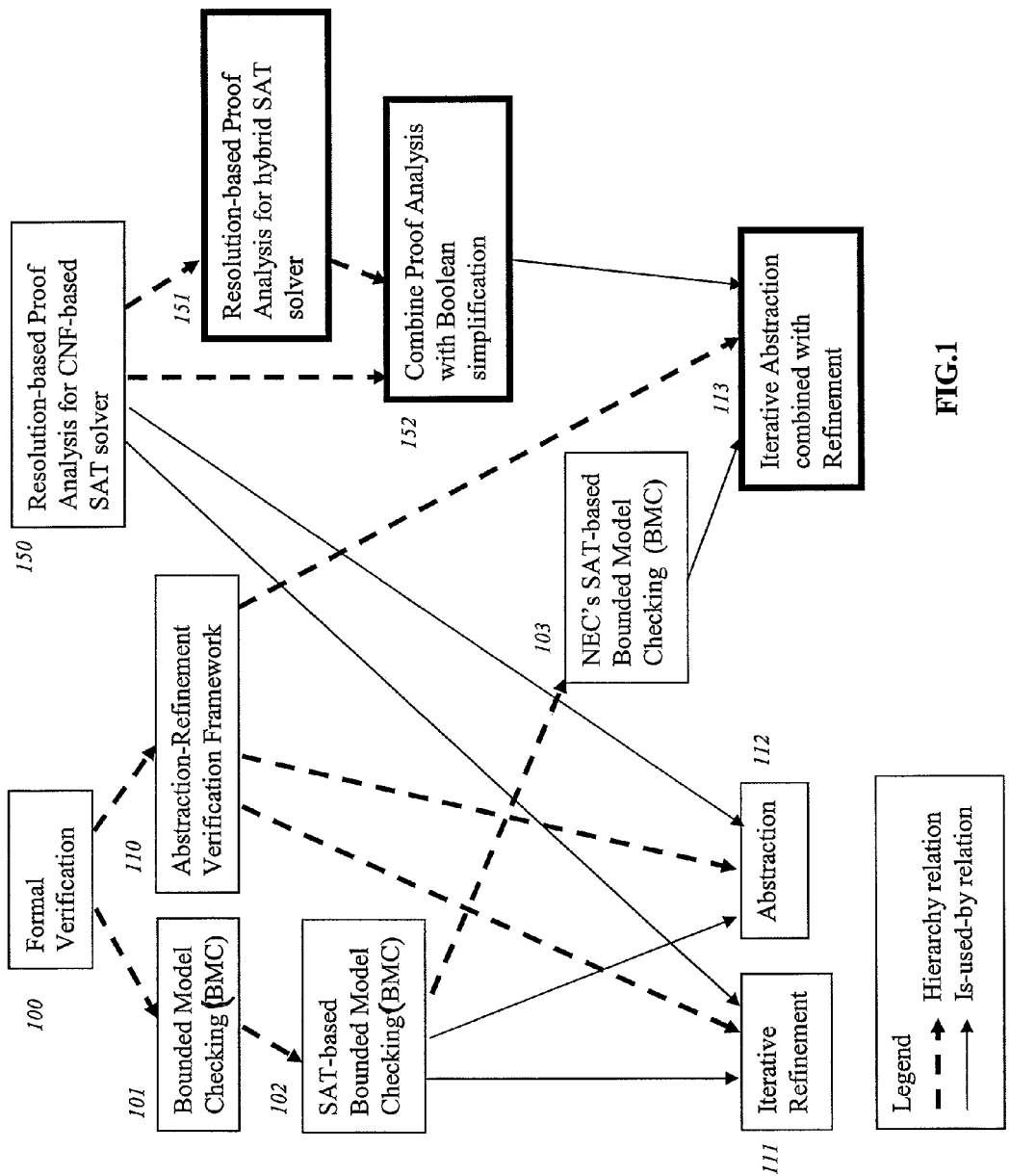
FIG. 1 shows some relationships between the disclosed teachings and related techniques.

We have employed SAT proof analysis techniques effectively, to obtain abstract models in a top-down iterative abstraction framework based on use of BMC in the inner loop. In our approach, a lack of a counterexample provides an opportunity to perform further abstraction. On the other hand, the presence of a counterexample does not necessarily require a refinement based on that particular counterexample.

In comparison to bottom-up approaches, our top-down approach may need to handle much larger models. However, note that we do not require complete verification on these models for the purpose of abstraction. Instead, our abstraction method is based on SAT-based BMC, which we use up to some finite depth to check for counterexamples anyway. Furthermore, in practice, the first iteration of our iterative abstraction framework provides a significant reduction in model sizes, such that all successive iterations need to work on smaller models. One of the broader goals is to systematically exploit proof analysis with SAT-based BMC wherever possible.

We use the resolution-based proof analysis technique in the SAT solver used for checking BMC problems—we call this SAT-based BMC with Proof Analysis. Note that unsatisfiable SAT instances in BMC correspond to the absence of a counterexample of (or up to) a given depth. For each such depth, we identify an unsatisfiable core, and use it to generate an abstract model. In particular, we propose a latch-based abstraction, such that the resulting abstract models are guaranteed to not have a counterexample of (or up to) that depth.

Our overall verification methodology centers around a top-down iterative abstraction framework. Starting from the concrete design, we apply SAT-based BMC with Proof Analysis on a seed model in each iteration. Our abstraction, based on identification of unsatisfiable cores, is used to choose a seed model for the next iteration. Under certain practical conditions, we allow a refinement step, which can potentially increase the size of the seed model. In each iteration, we also generate existentially abstract models, again based on the unsatisfiable cores. These models are known to be conservative for LTL and ACTL properties [15]. We use various BDD-based and SAT-based methods for performing unbounded model checking on these models. A proof of correctness on any of these models guarantees correctness on the concrete design, while a counterexample may require a refinement, or going back to a previous iteration in our iterative flow. In practice, we iterate the loop until convergence of the seed model, or until a conclusive result is obtained on some abstract model.

A contribution of our work is that the overall flow is targeted at reducing the size of the seed models across successive iterations. The potential benefit is that for properties that are false, BMC search for deeper counterexamples is performed on successively smaller models, thereby increasing the likelihood of finding them. For properties that are true, the successive iterations help to reduce the size of the abstract models, thereby increasing the likelihood of completing the proof by unbounded verification methods.

We have implemented these ideas in a prototype verification framework called DiVer, which includes other BDD-based and SAT-based verification methods. We report on our experience on some large industry designs. For some of these, we have been able to complete proofs of correctness for the first time ever. In most of these, we have been able to perform deeper searches for counterexamples. We have also observed that our iterative abstraction typically gives an order of magnitude reduction in the final model sizes. For many examples, this reduction was crucial in enabling the successful application of the unbounded verification methods.

B. Relationship to Related Art

FIG. 1 shows an exemplary representation of how some of the implementations could be related to related art.

the dashed arrows indicate hierarchy relationships, i.e. from more general to more specific, and solid arrows indicate that the technique at the top is applied by the technique at the bottom.

As shown, aspects of the present teachings contribute specialized techniques under the two broad categories of formal verification (box 100) and resolution-based proof analysis techniques for SAT Solvers (box 150). Related art in the latter category consists of its use on CNF-based SAT Solvers. We have extended these techniques to work with a Hybrid SAT Solver (box 151). For both CNF-based, and Hybrid SAT Solvers, we have also proposed techniques to combine resolution-based proof analysis with Boolean simplification (box 152). Going back to the category of formal verification, the disclosed teachings address Bounded Model Checking (BMC) (box 101), which has traditionally been used with SAT Solvers (box 102). A related invention of ours included special techniques for performing SAT-based BMC (box 103), which we call NEC's SAT-based BMC. Our present teachings also address an Abstraction-Refinement framework (box 110), for which related art includes an iterative abstraction refinement framework (box 111), and an abstraction framework. The present teachings propose a new technique which uses Iterative Abstraction combined with Refinement (box 113).

In terms of applications (shown as solid arrows), SAT-based BMC and Resolution-based proof analysis techniques for CNF-based SAT Solvers have been used in related art, both for Iterative Refinement, and for Abstraction. Our current teachings use NEC's SAT-based BMC and our proposed Resolution-based proof analysis techniques for Iterative Abstraction combined with Refinement.

Figure 2:
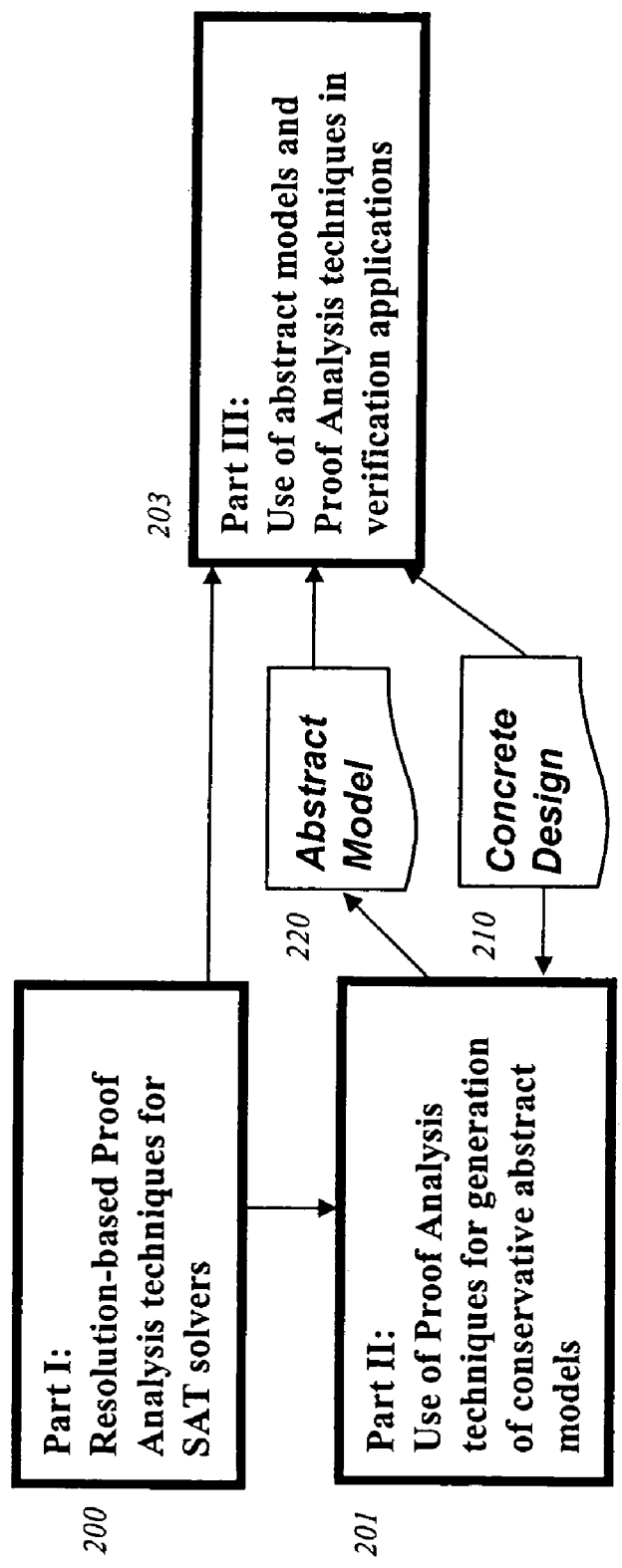
FIG. 2 shows a block diagram illustrating concepts related to the disclosed teachings.

There are three broad components of the disclosed teachings, as shown in FIG. 2. The first component (box 200) comprises Resolution-based proof analysis techniques for SAT solvers, which are used to generate a set of useful constraints from a given unsatisfiable problem. The second component (box 201) comprises use of the Resolution-based proof analysis techniques with SAT-based BMC on a given concrete design (box 210), in order to generate conservative abstract models (box 220), which are usually much smaller than the concrete design. The third component (box 203) comprises use of these conservative abstract models and Resolution-based proof analysis techniques with SAT-based and BDD-based model checking methods within an Iterative Abstraction-Refinement framework, to improve the overall quality of verification for the concrete design. These components are described in detail. In the figures that follow, boxes with thick outlines denote parts that are direct implementation of the disclosed teachings.

C. Proof Analysis for a Hybrid SAT Solver

1. Basics: Identification of An Unsatisfiable Core

Figure 15:
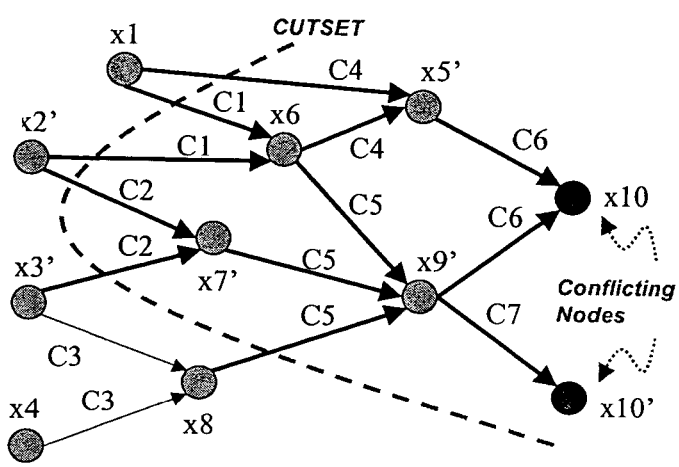
FIG. 15 is an example of an implication graph leading up to a conflict.

Conflict analysis takes place whenever a conflict is discovered by a SAT solver during BCP (Boolean constraint propagation). The implications are typically stored in the form of an implication graph. In this graph, a node denotes a variable with a value (a literal), and an edge into a node denotes the clause, called the antecedent, which caused the implication on the node's variable. Nodes with no incoming edges denote decision variables. A conflict is obtained whenever the graph has two nodes for the same variable with opposite values. A small example of an implication graph leading up to a conflict is shown in FIG. 15.

Conflict analysis takes place by following back the edges leading to the conflicting nodes up to any cutset in this graph. A conflict clause can then be derived from the variables feeding into the chosen cutset. A feature of a learned conflict clause is that it is also the result of resolution on all the antecedent clauses, which are traversed up to the chosen cutset. For proof analysis, these antecedents (reasons) are recorded and associated with the learned conflict clause, as also shown in FIG. 15.

When a SAT solver determines that a given problem is unsatisfiable, it does so because there is a conflict without any decisions being taken. A conflict analysis can again be used to record the antecedents for this final conflict. This time, the learned conflict clause, i.e. a resolution of all its antecedents, is an empty clause. Therefore, this final resolution tree constitutes a proof of unsatifiability, except that it may include some learned clauses. Recall that a learned clause is itself a resolution of the antecedents associated with it. Therefore, by recursively substituting the resolution trees corresponding to the learned clauses into the final resolution tree, a resolution proof only on the original clauses can be obtained. These original clauses constitute an unsatisfiable core, i.e. they are sufficient for implying the unsatisfiability. In practice, the resolution tree is created only if a check is needed for the unsatisfiability result.

For the purpose of identifying an unsatisfiable core, a marking procedure is used, which starts from the antecedents of the final conflict graph, and recursively marks the antecedents associated with any marked conflict clause. At the end, the set of marked original clauses constitutes an unsatisfiable core.

2. Adaptation to Hybrid SAT Solver

The proof analysis technique is extended to work with a hybrid SAT solver. A hybrid SAT solver uses hybrid representations of Boolean constraints, e.g. where a circuit netlist is used to represent the original circuit problem, and CNF is used to represent the learned constraints. Conflict analysis in a hybrid SAT solver also traverses back from the conflicting nodes in an implication graph. However, edges in such a graph may correspond to hybrid representations of constraints. For example, while performing BCP directly on a circuit netlist, edges might correspond to nodes in the circuit. We record the reasons for the conflict, in their hybrid representations, and associate them with the learned constraint (corresponding to the conflict clause). When the final conflict is found, indicating the unsatisfiability, a marking procedure is started from its antecedents. Again, reasons for any learned constraints are marked recursively. At the end of this procedure, the marked constraints from the original problem constitute an unsatisfiable core. For example, given an unsatisfiable circuit problem due to external constraints, this procedure identifies a set of nodes in the circuit that are sufficient for implying the unsatisfiability.

3. Reducing the Size of the Unsatisfiable Core

By iterating SAT checking on the unsatisfiable core, the number of original clauses/variables needed for unsatisfiability can be reduced significantly. Also, the constraints constituting the unsatisfiable core are related to the particular conflict clauses learned by a SAT solver. These, in turn, depend upon other heuristics in the SAT solver, e.g. decision heuristics, heuristics for choosing a cutset during conflict analysis etc. We vary these heuristics in different runs of the SAT solver, in order to obtain a potentially smaller unsatisfiable core.

4. Exemplary Implementation

An exemplary implementation is presented herein. A resolution-based proof analysis technique for SAT (referred to as a "proof analysis technique") identifies a sufficient set of reasons (constraints) for an unsatisfiability result proved by a SAT solver.

Figure 3:
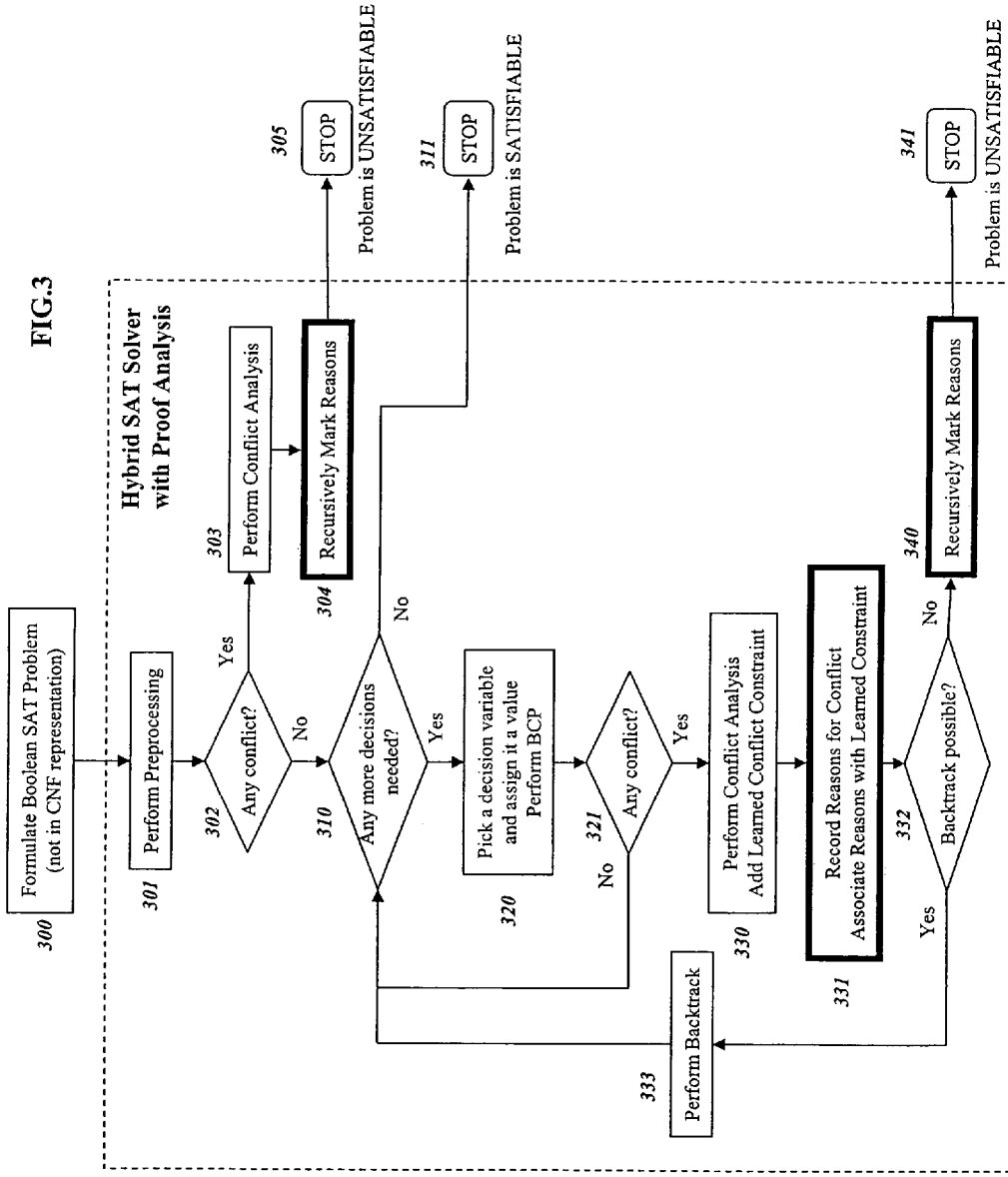
FIG. 3 shows an example implementation of the disclosed proof analysis technique.

(a) SAT proof analysis techniques which use CNF (Conjunctive Normal Form) representation for the given Boolean SAT problem is extended to work with a hybrid SAT solver. A hybrid SAT solver uses hybrid representations of Boolean constraints, e.g. where a circuit netlist is used to represent the original circuit problem, and CNF is used to represent the learned constraints. An example implementation for a SAT solver with Proof Analysis is shown in FIG. 3. Given a SAT problem, not in CNF form (box 300), we start with preprocessing (box 301). If this generates a conflict (box 302), conflict analysis is performed (box 303). This is followed by marking all the reasons for implications which lead to the conflict (box 304). Note that since the reasons are themselves constraints, they have hybrid representations in a hybrid SAT solver.

If, due to the conflict, the problem is unsatisfiable, we terminate (box 305). If there is no conflict found during preprocessing, we proceed to check if any more decisions are needed on variables (box 310). If not, then the problem is found to be satisfiable, and we terminate (box 311). Otherwise, we pick a decision variable and its value using some heuristics, and perform Boolean Constraint Propagation (BCP) (box 320). Next, we check if there is any conflict (box 321). If not, then we loop back to box 310.

However, if a conflict is found, then a conflict analysis is performed and the learned conflict constraint is added to the Boolean problem (box 330). Again, we record the reasons for implications which lead to this conflict (box 331). These reasons are associated with the learned constraint, e.g. the conflict clause, generated by conflict analysis. Since a conflict was found, we need to backtrack. If it is possible to undo some previous decisions on variables, i.e. a backtrack is possible, we perform backtrack (box 333) and loop back to box 310. Otherwise, the problem is proved to be unsatisfiable. We use a recursive marking procedure to find a sufficient set of reasons for the unsatisfiability (box 340). This procedure marks the reasons for implications leading to the current conflict, which occurs without any decisions being taken. Furthermore, if any of these reasons correspond to learned constraints, then their reasons also are marked recursively. At the end of this procedure, the marked reasons from the original problem constitute a sufficient set of constraints for the unsatisfiability. Since the problem is proved to be unsatisfiable, we terminate (box 341).

Figure 4:
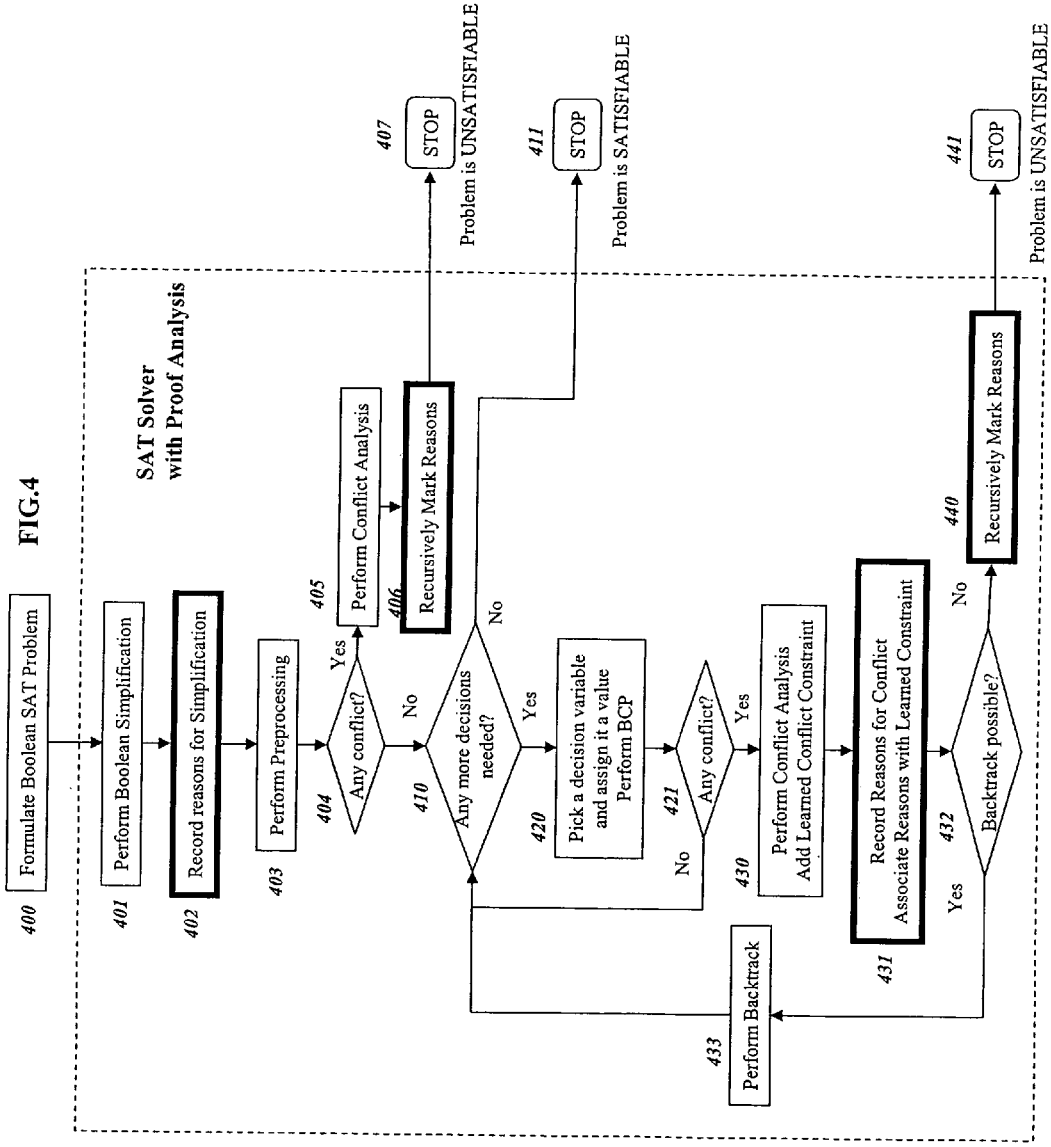
FIG. 4 shows an example implementation of the disclosed proof analysis with boolean simplification.

(b) For SAT problems arising from specific domains, such as the circuit domain, prior Boolean simplification can interfere with proof analysis techniques. An example of such simplification is reduction of certain variables to constants. In such cases, the set of marked constraints on the simplified problem may not be sufficient with respect to the original problem. We have extended proof analysis techniques, for CNF-based as well as hybrid SAT solvers, to work with Boolean simplification also. This is shown in FIG. 4. Given a SAT problem (box 400), we first perform Boolean simplification (box 401), and record additional information corresponding to the constraints and reasons for simplification (box 402). For example, if a variable is simplified to be a constant, then we record a learned constraint, and the reasons for that.

Next, we follow the procedure as described in (a) above (boxes 403-405, boxes 407, 410, 411, 421, 430, 431, 432, 433, 440, and 441 are similar to boxes 305, 310, 311, 321, 330, 331, 332, 333, 340, and 341 respectively). If the problem is unsatisfiable, then a recursive marking procedure is invoked (boxes 406, and 440). In this procedure, reasons for all learned constraints, including those derived during Boolean simplification, are marked recursively. Again, the marked reasons from the original problem constitute a sufficient set of reasons for unsatisfiability in the presence of Boolean simplification.

(c) When we use an incremental SAT solver (CNF-based/hybrid, with/without Boolean simplification), the reasons for a conflict may include learned constraints that were learned during previous runs of the SAT solver. Therefore, we save the association between a learned constraint and its reasons (box 331 in FIG. 3, and box 431 in FIG. 4) across different runs of the SAT solver. Whenever the recursive marking procedure for proof analysis (boxes 304, and 240 in FIG. 3; boxes 406, and 440 in FIG. 4) marks such a learned constraint, its reasons are marked recursively.

(d) The sufficient set of constraints identified by a SAT solver (CNF-based, or hybrid) are related to the particular conflict constraints learned by the SAT solver, which in turn depend upon other heuristics in the SAT solver. We vary these heuristics in different runs of the SAT solver in order to obtain a potentially smaller set. For example, we use different decision heuristics (box 320 in FIG. 3; box 420 in FIG. 4), which reduces the sufficient set for many problems we have seen.

(e) The proof analysis techniques identify a sufficient set of constraints for the unsatisfiability proved by the SAT solver. However, in case the sufficient set is too large to be handled, we also use prioritization techniques to derive a smaller set of constraints. The prioritization techniques may utilize additional information from the SAT solver, e.g. direction of implication, or scoring mechanisms depending on the application context of the proof analysis technique.

D. Generation and Verification of Abstract Models

We use a proof analysis technique in the SAT solver used to check BMC problems. For each depth checked, the lack of a counterexample corresponds to an unsatisfiable SAT instance. We identify an unsatisfiable core in each such instance.

1. SAT-based BMC with Proof Analysis

For ease of exposition, consider that we use SAT-based BMC to search for counterexamples of increasing depth k, $1 \leq k \leq k_{max}$. If there is no counterexample of depth k, i.e. the check for depth k is unsatisfiable, we obtain the unsatisfiable core, and denote it R(k) (Reasons for depth k). Note that this corresponds to a set of clauses for a CNF-based SAT solver, or a set of circuit nodes and external constraints for a hybrid SAT solver using a circuit-netlist representation for the given design. Our techniques described in the rest of this paper do not depend upon which representation is actually used.

2. Sufficient Abstract Models

Given an unsatisfiable core R(k), which was identified by BMC with Proof Analysis at depth k, we generate an abstract model which preserves the unsatisfiability implied by constraints in R(k). At the same time, we want to keep the size of the abstract model small. Rather than optimize at the level of each gate in the original design, our abstraction tries to minimize the number of latches to include in the abstract model, while still retaining the useful property that there is no counterexample of depth k.

It should be noted that in this disclosure, we do not distinguish between a "latch" and a "flip-flop", and use either to denote any state-storing element in a sequential design.

a) Latch Interface Abstraction

Let BMC(k) denote the translation of the k-instance BMC problem into a Boolean formula. We regard BMC(k) to consist of the following sets of constraints:

Gate constraints for each gate in the unrolled design: these constraints model the gate functionality.

External constraints Ext(e) imposed on a node e in the unrolled design: arising due to the property translation, or imposed by the designers to model environment constraints.

Latch interface constraints IF(L,k): for each latch L in the transition relation of the design, there are k+1 constraints. We use the term transition relation to denote the entire combinational logic of the design, including next-state logic for the latches, as well as output logic for nodes on which external constraints are imposed in the unrolled design. Of these, k constraints correspond to equality of the latch output at depth i, with the latch input at depth i−1, for $1 \leq i \leq k$. We denote these as interface propagation constraints. In addition, there is one more constraint corresponding to equality of the latch output at depth 0, with the initial state value for that latch. We denote this as the initial state constraint.

Figure 6:
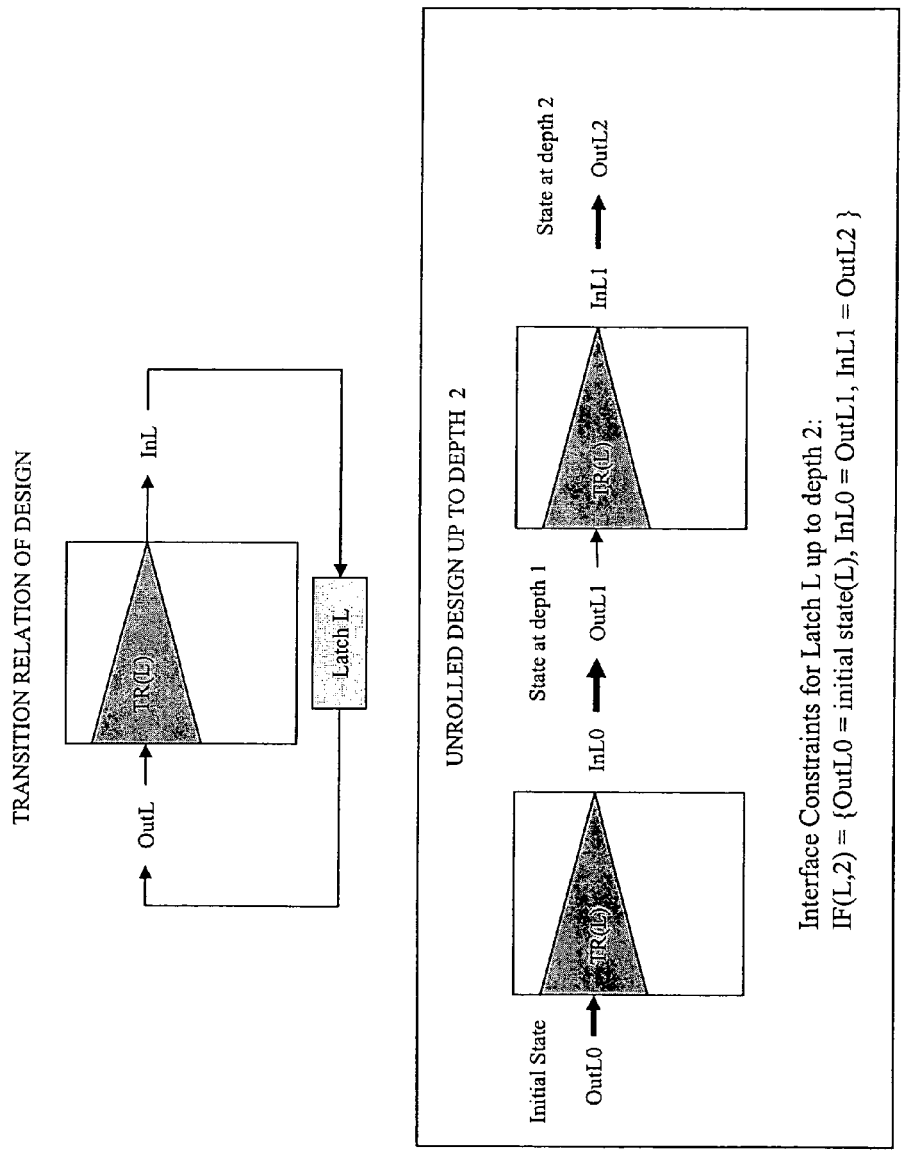
FIG. 6 is a block/flow diagram illustrating an example of interface constraints IF(L,k) for a latch in a design for k=2.

We use the following notation to describe our abstraction. For a node v in the unrolled design, let F(v) denote the node corresponding to it in the transition relation of the design. For a given node e in the unrolled design, let Ext(e) denote the (possibly empty) set of external constraints imposed on node e. For a given latch L in the transition relation of the design, let IF(k,L) denote the set of its latch interface constraints in the unrolled design up to depth k. FIG. 6 shows an example of interface constraints IF(L,k) for a latch in a design for k=2. Note that any k-depth unrolling of the design would necessarily include these constraints for each latch, either explicitly, or implicitly, in the problem representation.

We propose a latch interface abstraction, which works as follows:

Step 1: Given R(k), we first mark a node v in the unrolled design, if variable v appears in some constraint in R(k). For each such v, we say that node v is marked.

Step 2: For each marked node e, such that some constraint in Ext(e) belongs to R(k), we perform a backward DFS traversal starting from e, through only marked nodes, using the procedure shown in FIG. 16. Note that the recursive traversal on marked nodes is terminated at any unmarked node, but is otherwise continued through the fanin nodes. Any marked node which is visited during such a traversal is called visited.

Step 3: For each latch L, we say that L is visited if any of the nodes denoting its output at time frame i, $0 \leq i \leq k$, is visited.

Step 4: We extract the combinational fanin cones of all latches that are visited. We also extract combinational fanin cones of all nodes F(e) such that Ext(e) is not empty. These fanin cones represent the transition relation of our abstract model. In particular, all latches that are not visited are abstracted away as pseudo-primary inputs.

The resulting abstract model is called a sufficient model for depth k, denoted SM(k). Since it is generated by abstracting away some latches as pseudo-primary inputs, it is known to be conservative for LTL and ACTL properties [1, 15], i.e. truth of a property on the abstract model guarantees its truth on the given design. It has an additional useful property, stated in the following theorem.

Theorem 1: The sufficient model SM(k) generated using the latch interface abstraction does not have any counterexample of depth k.

Proof: Recall that constraints in R(k) are sufficient to generate implications (without taking any decisions), which lead to a conflict at some node in the unrolled design, corresponding to the final conflict graph. The latch interface abstraction uses circuit connectivity information to prune away those constraints in R(k) which are not needed to obtain the final conflict. Consider a marked node that does not have a transitive fanout path, through other marked nodes, to a marked node with an external constraint in R(k). We claim that such a node is not needed to obtain the final conflict. This is because implications only on inputs of a circuit node cannot cause a final conflict on the output of that node. The same reasoning can be used to show that there can be no final conflict on any of its marked but unvisited transitive fanouts. Therefore, at the end of Step 2, the set of visited nodes and their associated constraints are guaranteed to lead to a final conflict.

Due to the structure of the unrolled design, all transitive paths connecting visited nodes in different time frames have to go through latch interfaces between those time frames. Therefore, each visited node is contained in the combinational fanin cone of some visited latch output node, or some visited node on which an external constraint is in R(k). The abstract model SM(k) includes all such combinational fanin cones in its transition relation (Step 4). Therefore, all visited nodes and their constraints are included in a k-depth unrolling of the abstract model. Therefore, we are guaranteed to get a final conflict without any decisions, thereby proving that the abstract model SM(k) cannot have any counterexample of depth k.

We also use an alternative abstraction, where we skip the recursive DFS traversal in Step 2 altogether. We consider a latch L to be marked, if any of its output nodes in any time frame is marked (not visited), i.e. if any constraint in IF(k, L) belongs to R(k). In this case, the abstract model consists of the combinational fanin cones of all marked latches, and all external constraint nodes. The reasoning in our proof works also for this cheaper (to compute) abstraction. Indeed, the proof of sufficiency works, while pruning R(k), for any subset S of latches, such that $\{L|\ visited(L)\} \subseteq S \subseteq \{L|\ marked(L)\}$. In the remainder of this paper, we denote the abstract model corresponding to any such set S as SM(k), since it is guaranteed to not have a counterexample of depth k. In cases where an external constraint corresponds to environment constraints provided by a designer, an alternative is to include it in the abstract model only if it belongs to R(k), for subsequent verification using the abstract model.

b) Pruning due to Latch Interface Abstraction

The unsatisfiable core R(k) can include a node in the unrolled design, on which constraints are not needed to generate the final conflict. The pruning obtained by the latch interface abstraction in Step 2 is geared at throwing away these nodes, without losing sufficiency for the unsatisfiability.

Figure 17:
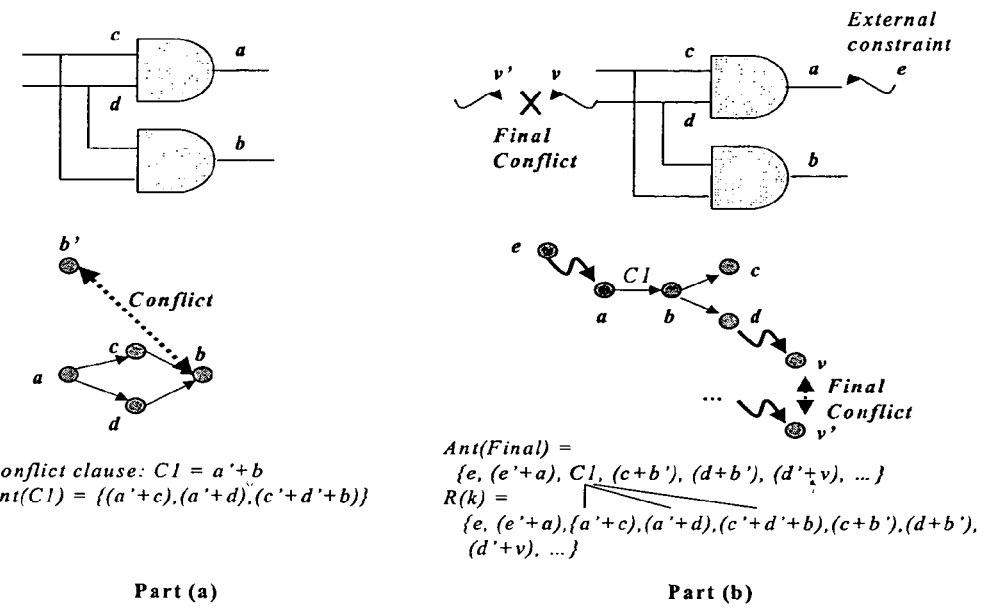
FIG. 17 shows an example of pruning R(k).

A small example of how this can happen is shown in FIG. 17. Part (a) of this figure shows the implication graph at the time of learning the conflict clause C1: (a'+b), and the associated antecedents. In Part (b), we show a final conflict graph, where implications from an external constraint on node e imply variable a to 1, which leads to use of the conflict clause to imply b to 1. This further leads to c and d being implied to 1, with the implication on d leading to a final conflict on node v. Given this final conflict graph, the recursive marking procedure for R(k) starts by including antecedents for implications from the circuit clauses (from e to a, from b to c, ... etc.). Furthermore, it substitutes the antecedents of the conflict clause, leading to R(k) as shown in the figure.

Suppose there is no implication from any external constraint on the value of variable b, i.e. it does not matter what value b takes. The reason that constraints involving b even appear in R(k) is that the required values on c and d, needed for the final conflict, are used to imply a consistent value on their fanout variable b. As noted in our proof, implication values existing only on inputs of node b cannot lead to a conflict on b. Therefore, our abstraction prunes away the constraints associated with b. Note from the circuit shown at the top of Part (b), that when the gate corresponding to variable b is removed, the implication from a to d can still be used to obtain the final conflict. Indeed, if the SAT solver had used this implication directly, the conflict clause C1 may never have been used at all. However, in general, we cannot rely on the SAT solver to use the implication from a to d, instead of the transitive implications from a to b, and b to d. In case d is far away from a, say through a chain of buffers, it may actually be faster for the SAT solver to use the learned clause C1, than not to use it (which is how conflict clauses help to improve SAT solver performance).

c) Other Applications

It is instructive to recall that the set R(k) is sufficient, but not necessary, for unsatisfiability. As described in the previous section, the latch interface abstraction prunes the given sufficient set R(k) further, to yield another sufficient set. We can use this pruned sufficient set for other applications as well. In particular, we can use it to identify refinement candidates for counterexample guided abstraction refinement [12]. Rather than choosing all latch nodes at the failure interface marked by R(k), we can use the latch nodes in the pruned sufficient set as refinement candidates. This can potentially reduce the number of candidates.

Another application is in verification of safety properties. If the pruned set of constraints does not include any constraint due to initial state of a latch, then it represents an inductive invariant. Note that though initial state constraints are enforced in the BMC SAT problem at depth k, if the pruned set of sufficient constraints does not contain any, then this constitutes a proof of unsatisfiability when starting from an arbitrary initial state. This corresponds to an inductive step in a proof by induction with increasing depth [5, 16]. By separately checking the basis step, a complete proof by induction can be obtained for the safety property.

3. Accumulated Sufficient Abstract Models

When using BMC on increasing depth k, it is useful to identify the accumulated unsatisfiable core for depth k, denoted AR(k). (It can also be identified from a single unsatisfiable BMC problem, which checks the existence of a counterexample of any depth up to k.)

We use an abstraction similar to that defined in the previous section, where the accumulated unsatisfiable core AR(k) is used in place of R(k). The resulting model is called an accumulated sufficient model for depth k, denoted ASM(k). Following a similar reasoning as in the proof of Theorem 1, it can be shown that the model ASM(k) does not have any counterexample of depth less than or equal to k.

4. Insufficient Abstract Models

A purpose of generating abstract models is to enable use of complete verification methods, such as symbolic model checking [1, 2], or a proof by induction for safety properties [5, 16]. Typically, such methods do not work well on large models. Therefore, if the abstract models resulting from the entire unsatisfiable core are too large, we may not be able to apply these methods. This is typically the case for many industry designs, especially when k gets large (some data are provided in Section 6).

The latch interface abstraction already includes some pruning of the set R(k) (or AR(k)), which is guaranteed to retain the unsatisfiability at (or up to) depth k. It is also possible to arbitrarily pick any subset of visited latches required by the latch interface abstraction. The choice can be dictated by heuristic criteria such as—at what depth was its output node visited, at how many depths was its output node visited, etc. The abstract model derived by retaining some, but not all, of the visited latches is called an insufficient model. It is not guaranteed to exclude a counterexample of any length. However, it can potentially exclude many in practice. The important point is that it is still conservative for verification of LTL properties. In comparison to models derived from localization reduction [17], which is based on a static cone of influence analysis, an insufficient model based on proof analysis may better capture the needed invariant for all depths. We are currently exploring heuristics for obtaining useful insufficient abstract models.

5. Exemplary Implementation for Iterative Abstraction

Figure 8:
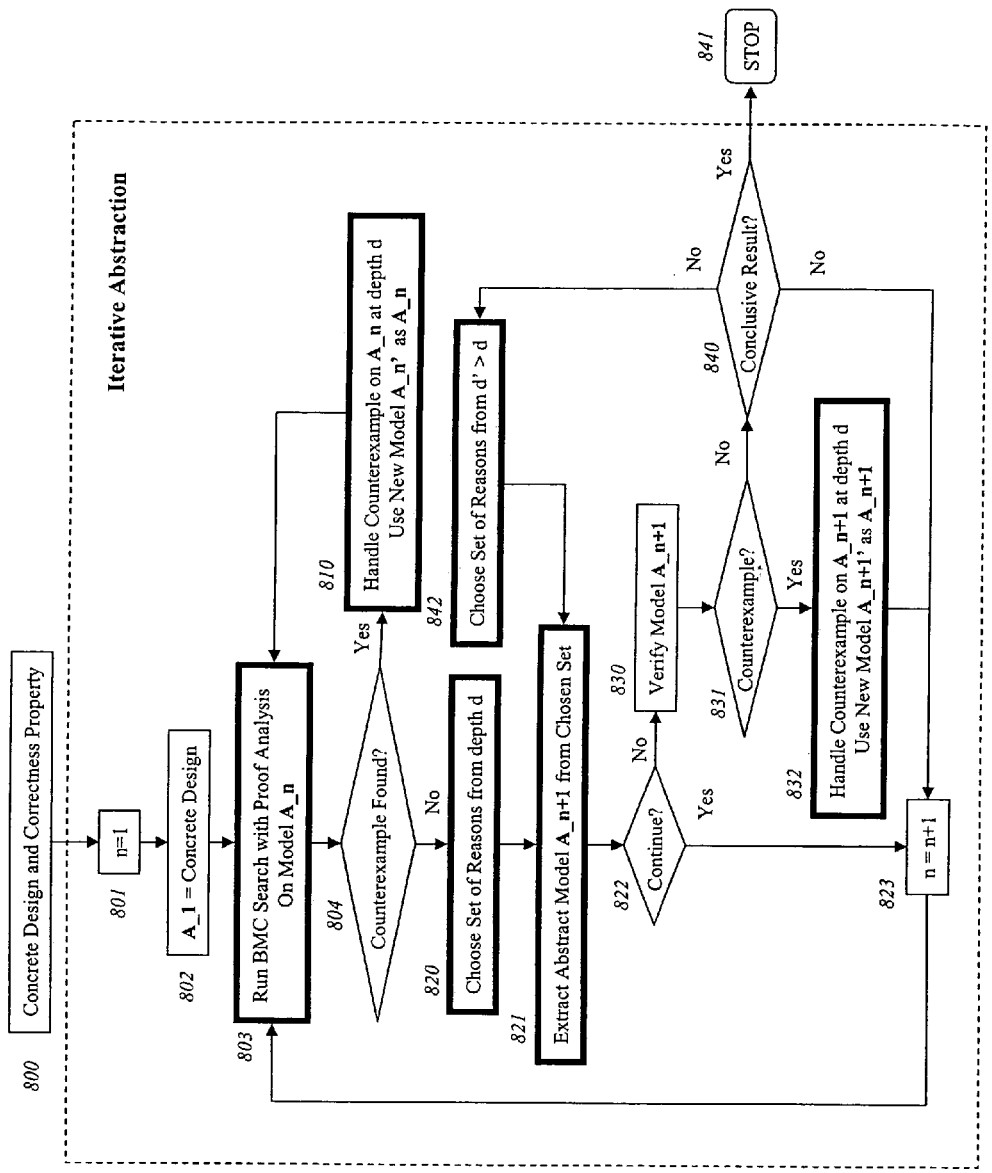
FIG. 8 is a block/flow diagram illustrating an iterative abstraction framework.

Our verification methodology is based on an iterative abstraction framework, based on the use of BMC with Proof Analysis and the related abstractions in the inner loop. An exemplary implementation for an overall flow is shown in FIG. 8.

a) Inner Loop of the Framework

Each iteration of our framework, indexed by n as shown in the figure, consists of applying SAT-based BMC with Proof Analysis on a given seed model $A_n$. The seed model for the initial iteration is the concrete design. In each iteration, we run BMC with Proof Analysis up to some fixed depth (potentially different for each iteration). The proof analysis technique is used to identify the unsatisfiable cores for each depth k when there is no counterexample. If a counterexample is found at some depth d, it is handled as described in the next section. The result of such handling is that we may obtain a new seed model $A_n'$ potentially larger than $A_n$, and we repeat the current iteration.

On the other hand, if no counterexample is found by BMC, we heuristically choose one of the sets AR(d) at some depth d. For example, we can choose a set that remains unchanged for a certain number of time frames. Then we use any abstraction technique which is guaranteed to exclude all counterexamples of depth less than or equal to d, in order to generate the corresponding accumulated sufficient model ASM(d). Specifically, we can use any version of the latch interface abstraction proposed in this paper, or the abstraction proposed by conventional techniques [13]. The ASM(d) model is used as the seed model $A_{n+1}$ for the next iteration. If we don't wish to continue, e.g. if the seed model $A_{n+1}$ is small enough, or if model $A_{n+1}$ is unchanged from model $A_n$, we attempt to verify the abstract models generated in this iteration. This is described in more detail subsequently.

The result of such verification is that we can get a counterexample (handled as described next), or a conclusive result (we can stop), or an inconclusive result. In the last case, we can either try to reduce the size of the seed model by performing another iteration, or we can choose to extract an abstract model from a depth d' greater than d from the current iteration itself.

b) Handling Counterexamples

Figure 9:
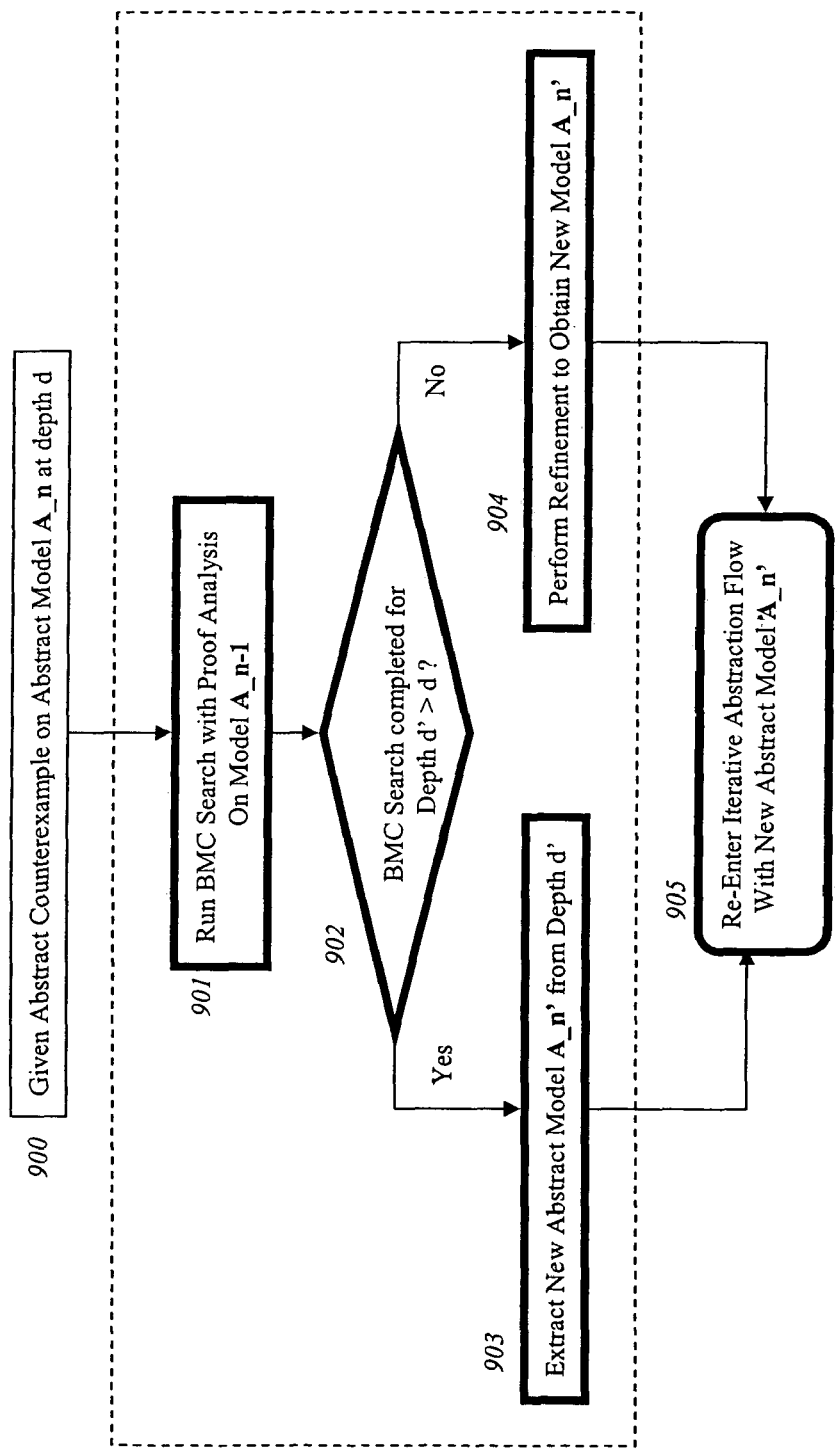
FIG. 9 is a block/flow diagram illustrating a method for generating a new model for the same iteration of an iterative abstraction flow.

Our scheme for handling counterexamples is shown in FIG. 9. Given a counterexample on a model $A_n$ at depth d, we first check if model $A_n$ is the concrete design. If it is, then we have found a true counterexample. However, for n>1, the counterexample could be spurious, since it was obtained not on the concrete design, but on an abstract model.

In case the counterexample is spurious, we attempt to run a deeper BMC search on seed model $A_{n-1}$ from the previous iteration, in order to choose AR(d'), at some depth d'>d. Note that, in practice, it may not always be possible to run BMC deeper than d. If we can, we extract the corresponding model ASM(d'). Otherwise, we perform a proof analysis-based refinement to remove the counterexample in case it is spurious [12]. For refinement, we use the pruned set of sufficient constraints, rather than the entire set R(k), to identify suitable refinement candidates. Alternatively, we can perform proof analysis-based refinement before attempting BMC search on seed model $A_{n-1}$ from the previous iteration.

Finally, we re-enter the iterative abstraction flow with the new model $A_n'$. This model is guaranteed to exclude at least the given counterexample, but is potentially larger than the model $A_n$.

c) Potential Benefits of Iterative Abstraction

Due to the sufficiency property of the abstractions, the seed model in each iteration can have counterexamples only at depths strictly greater than the depth d, from which it was generated in the previous iteration. Furthermore, it is no bigger than the seed model of the previous iteration, provided there are no refinements (which we typically use only when we cannot do a deeper search with BMC). The combined effect is that for properties that are false, BMC search for deeper counterexamples is performed on successively smaller models, thereby increasing the likelihood of finding them. For properties that are true, the successive iterations help to reduce the size of the abstract models, thereby increasing the likelihood of completing the proof by unbounded verification methods.

6. Verification of Abstract Models

We apply various complete, as well as incomplete, verification methods on the abstract models generated in any iteration of the iterative abstraction flow. We prefer to perform verification on the seed models (ASM(d) models), in order to derive benefits of iterative abstraction. However, in practice, if these models are too large, we use either the SM(d) models, or the insufficient abstract models, derived from any depth d checked by BMC.

We briefly mention the techniques we use, and highlight the benefit of using them on smaller abstract models.

We use symbolic model checking techniques [1, 2] on the abstract model. If the correctness property is proved true, it is guaranteed to be true on the concrete design as well. Due to the limited capacity of such methods, they are more likely to work on smaller abstract models.

We also use symbolic traversal techniques to perform a reachability analysis on the abstract model [1, 2, 25]. The computed reachable set corresponds to an over-approximate reachable set for the concrete design. These are used as additional reachability constraints for the BMC methods described below.

We use BMC (optionally with reachability constraints [16]) to search for a counterexample [4]. If there is no counterexample up to depth d, then it is guaranteed that there is no counterexample up to depth d in the concrete design either. In many examples, BMC can complete deeper searches on the smaller abstract models than on the larger concrete design.

For safety properties, we use BMC (optionally with reachability constraints [16]) to perform a proof by induction with increasing depth [5]. In many cases, a smaller model enables a proof of increased depth, which may succeed.

7. Exemplary Implementations of the Use of BMC Search with SAT Proof Analysis for Generation of Abstract Models Given a concrete design and a safety property, a k-instance SAT-based BMC Problem [10, 5] tries to find a counterexample of length k, by checking the satisfiability of the negated property on the iteratively unrolled concrete design up to depth k, starting from the initial state. The problem is satisfiable if and only is there exists a counterexample of length k [10, 5]. In practice, BMC Search checks k-instance BMC problems, for k=1 up to some $k_{max}$.

Figure 5:
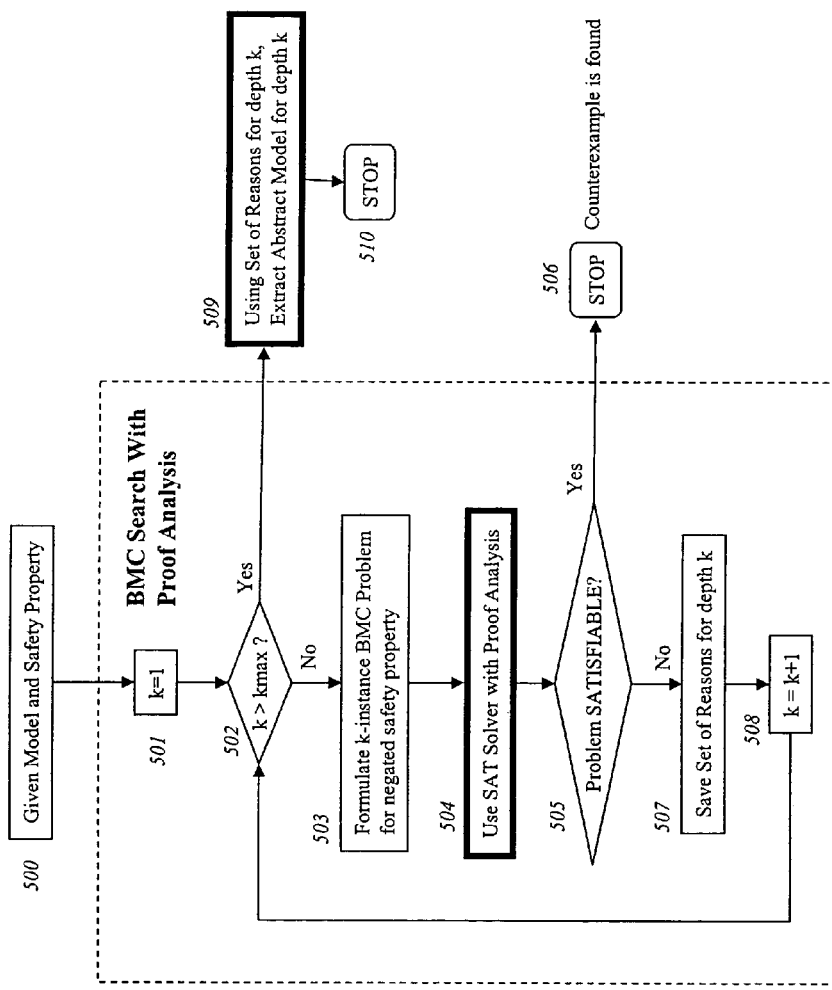
FIG. 5 is a block/flow diagram illustrating a bounded model checking (BMC) search with proof analysis.

(a) We use proof analysis techniques (described above) with BMC Search for generation of abstract models. Our use of BMC Search with Proof Analysis is shown in FIG. 5. Given a model and a safety property, we start at depth 1 (box 500). If we have not reached the maximum depth (boxes 501, 502) specified ($k_{max}$), then we formulate the k-instance BMC problem (box 503). Next, we use the SAT solver with Proof Analysis on this problem (box 504). If the problem is satisfiable (box 505), then a counterexample has been found (corresponding to the satisfying assignment of the SAT problem) and we terminate (box 506). However, if the problem is unsatisfiable, i.e. no counterexample of length k exists, then we save the set of reasons for the unsatisfiability, marked by the proof analysis technique, and associate this set with depth k (box 507). Next, we increment k (box 508). If we have reached the limit $k_{max}$, we stop (box 510). At this point, we have k sets of reasons, one for each depth up to k. These reasons are used to extract abstract models, one for each depth up to k (box 509).

Figure 7:
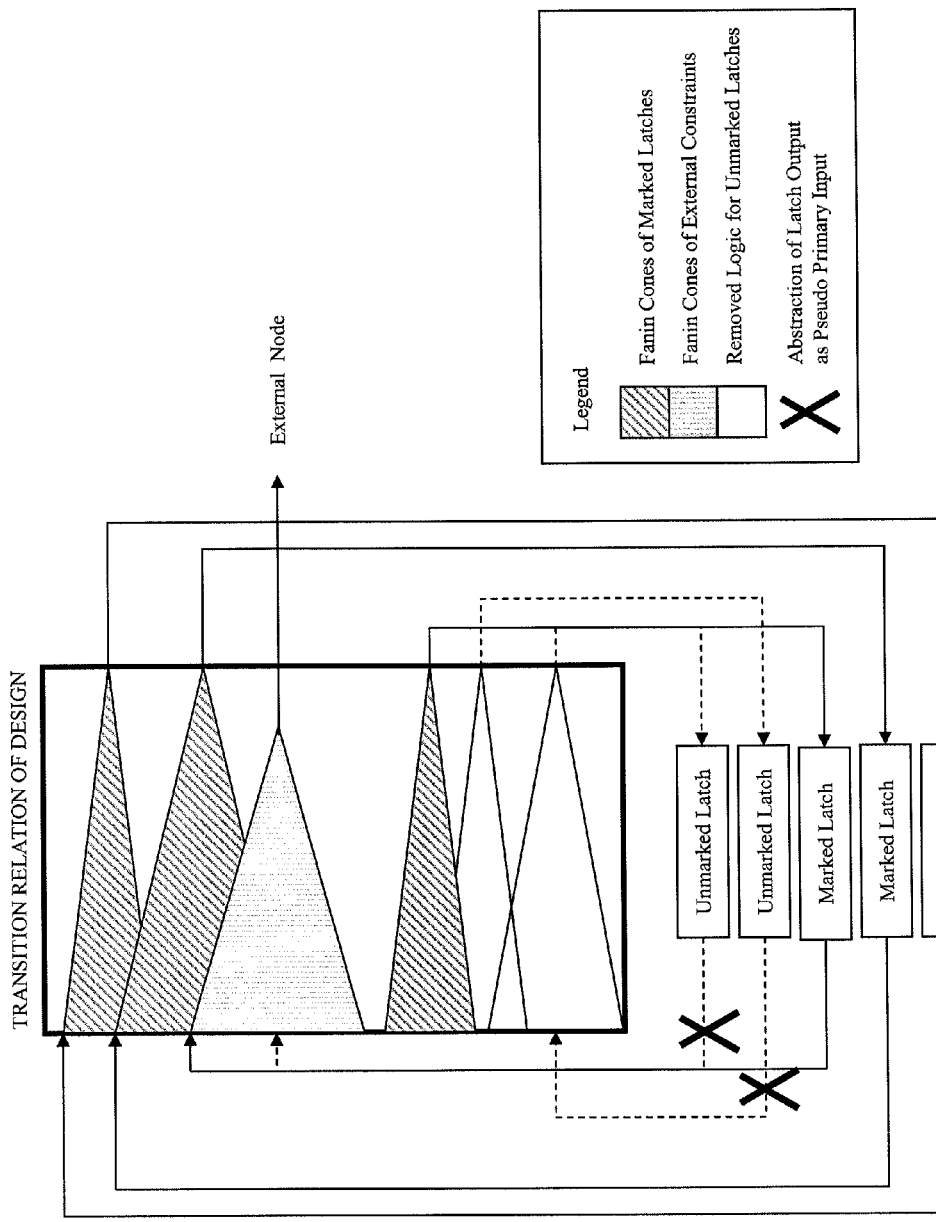
FIG. 7 is a transition relation of a design.

(b) Given a set of reasons R(d) which was identified by BMC Search with Proof Analysis at depth d, we use the following method to generate an abstract model for depth d. First, a subset of reasons C(d) is obtained from R(d), where the subset C(d) consists of components connected through constraints in R(d), to some external constraint in R(d). Alternately, the subset C(d) consists of components in the fanin cones of external constraints in R(d). Next, for each latch L in the transition relation of the concrete design, we perform a latch marking procedure as follows. Given a latch L, we consider the interface constraints IF(L) corresponding to equality of its output at time frame i−1 with its input at time frame i in the unrolled design, for all i less than or equal to d, and an additional constraints corresponding to the equality of its output at time frame 0 with its initial state value. The set IF(L) is shown pictorially in FIG. 6. If any constraint in IF(L) belongs to C(d), then we mark latch L. We also mark a node in the transition relation of the concrete design that has any externally imposed constraints, such as those due to the correctness property etc. Then, we extract the combinational fanin cones of all the marked latches, and all the marked nodes, as shown in FIG. 7. All unmarked latches are thereby abstracted away as pseudo-primary inputs. The resulting model is called a sufficient abstract model for depth d. It has the useful property that it has no counterexample of length d. Furthermore, replacement of any set of latches by pseudo-primary inputs corresponds to existential abstraction, and the resulting abstract model is known to be conservative for ACTL and LTL properties [6], i.e. truth of such a property on the abstract model guarantees its truth on the concrete design.

(c) For a safety property, suppose we have already checked that the property holds at all depths i<d, when starting from the initial state. Suppose we check next whether the negated property is satisfiable at depth d, and find that it is unsatisfiable. If the set of reasons C(d) for this proof of unsatisfiability does not include any initial state constraint, then this also serves as the induction step of a proof by induction. In this case, the property is true for all depths by induction.

(d) We use another abstraction method to generate a different abstract model for depth d. For this we use the accumulated sets of reasons R(k), for all depths k less than or equal to d. For each R(k), d≧k, we obtain C(k) and mark each latch L in the concrete design, according to the latch marking procedure described in 7(*b*). We also mark a node in the concrete design which has any externally imposed constraints, such as those due to the correctness property etc. Then we extract the combinational fanin cones of all the marked latches and all the marked nodes. All unmarked latches are abstracted away as pseudo-primary inputs. The resulting model is called an accumulated sufficient model for depth d. It has the useful property that it has no counterexample of length less than or equal to d. Again, the resulting models is also known to be conservative for ACTL and LTL properties.

(e) The sets of reasons R(d) for depth d may be pruned if needed (as described in C 4 (e)). Both abstractions described in 7(*b*) and (*d*) can be applied to the pruned sets. The resulting abstract models are called pruned models for depth d. They are not guaranteed to exclude counterexamples of any length. However, the models are still conservative for ACTL and LTL properties, i.e. truth of the safety property on the abstract model guarantees its truth on the concrete design.

8. Exemplary Implementation of Use of Proof Analysis Techniques and Derived Abstract Models in Verification Applications (a) We use a novel iterative abstraction framework based on use of BMC Search with Proof Analysis. This is shown in FIG. 8. Given a concrete design and a correctness property (box 800), we start with iteration index n=1 (box 801). The model for the first iteration, $A_1$, is chosen to be the given concrete design (box 802). In general, in the n-th iteration, we use BMC Search with Proof Analysis on the model $A_n$ (box 803). If a counterexample is found (box 804) during this search at depth d, we generate a new model $A_n$, for the same iteration (box 810), as described in 8 (*b*). However, if no counterexample is found up to some specified $k_{max}$ (potentially different for each iteration) we heuristically choose a sufficient set of reasons accumulated up to a certain depth d from 1 to $k_{max}$ (box 820). For example, we can choose a set that remains unchanged for a certain number of time frames. Next, we extract the accumulated sufficient abstract model for depth d (box 821), as described in 7(*d*). This is used as the model $A_{n+1}$ for the next iteration. If we wish to continue (box 822) the abstraction flow, we increment the iteration index n (box 823), and loop back to perform the next iteration (box 803). If we don't wish to continue, e.g. if resources for this iteration have been exhausted, or if model $A_{n+1}$ is unchanged from model $A_n$, we attempt to verify the abstract model $A_{n+1}$ (box 830).

We use various methods for this verification, described later in (d)-(h). If the verification finds a counterexample (box 831) for model $A_{n+1}$ at depth d, then we handle this counterexample (box 832), as described in 8 (*b*). If no counterexample was found, and a conclusive result was obtained (check in box 840), then we can stop (box 841) with the conclusive result holding for the concrete design. If the result was inconclusive, e.g. if verification could not be completed, then we can either (1) choose a different set of reasons at a depth d' which is greater than the depth d from which model $A_{n+1}$ was extracted (box 842), provided d' is less than $k_{max}$ of this iteration; or (2) we can choose to perform the next iteration by incrementing the iteration index n (box 823). The loop is guaranteed to terminate due to the finite concrete design, and in the worst case BMC may need to run up to the longest possible path in the concrete design.

(b) Given an abstract counterexample found on an abstract model $A_n$ at depth d (box 900), we use the procedure shown in FIG. 9 to generate a new model $A_n$, for the same iteration of the iterative abstraction flow. We first run BMC Search with Proof Analysis on model $A_{n-1}$ from the previous iteration up to some depth d'≧d (if this hasn't been done already) (box 901). If BMC Search can be completed for some depth d'>d (box 902), we extract ASM(d') use it as the new model $A_n$, (box 903). Otherwise, we use a refinement procedure described in 8(*c*) to obtain a new model $A_n$, (box 904). In either case, we re-enter the Iterative Abstraction Flow with the new model $A_n$, (box 905).

Figure 10:
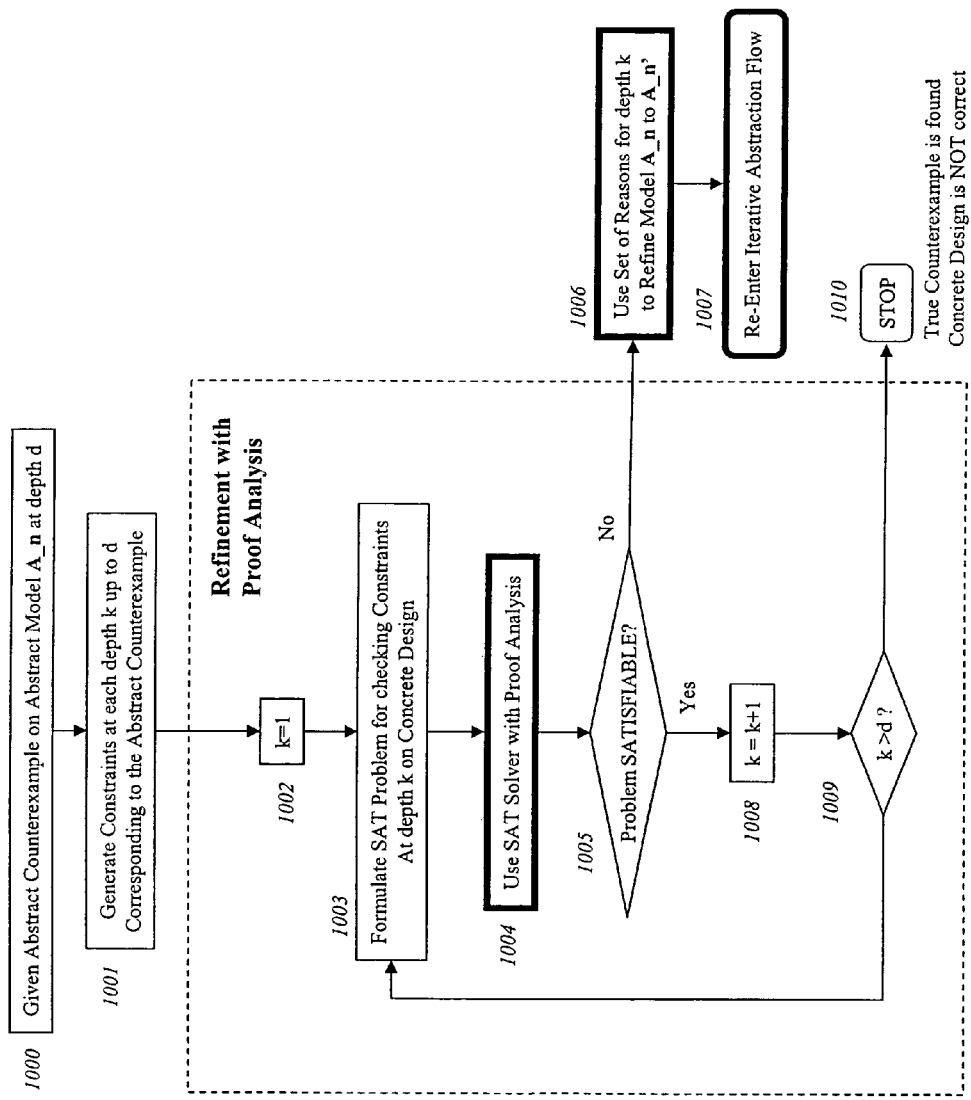
FIG. 10 is a block/flow diagram illustrating a proof analysis-based refinement procedure.

(c) The proof analysis-based refinement procedure works as shown in FIG. 10. Given a counterexample on model $A_n$ at depth d (box 1000), we first generate Boolean constraints corresponding to the counterexample, separately for each time frame up to d (box 1001). The Refinement with Proof Analysis procedure starts from time frame k=1 (box 1002). We formulate the SAT problem for checking constraints at time frame k on the concrete design (box 1003). Next, we use the SAT solver with Proof Analysis on this problem (box 1004). If the problem is unsatisfiable (box 1005), then the abstract counterexample is spurious at time frame k. We use the reasons for the unsatisfiability at time frame k, to refine the model $A_n$ to $A_n$, (box 1006 and 1007). Specifically, we use the pruned set of sufficient constraints, rather than the entire set R(k), to identify suitable refinement candidates. Refinement is targeted at adding latches to the model $A_n$, in order to remove the spurious counterexample. However, if the problem is satisfiable, then we increment index k (box 1008). If k is greater than d (box 1009), then we have found a true counterexample on the concrete design, and we stop (box 1010). We actually quit also from the surrounding iterative abstraction flow. Otherwise, we loop back to checking constraints at the new k (box 1003).

We perform the following verification applications on any of the abstract models generated by the iterative abstraction framework:

(d) We use BMC Search technique to search for a counterexample on the abstract model $A_n$, as shown in FIG. 11 (boxes 1100-1102). If there is no counterexample up to depth k (box 1103), then it is guaranteed that there is no counterexample up to depth k in the concrete design either, i.e. the concrete design is correct up to depth k. In many cases, BMC Search can do deeper searches on the smaller abstract models than on the larger concrete design. However, if a counterexample is found (box 1104), then we can handle it as described in 8(*b*).

(e) For safety properties, we use BMC Proof technique [5] to perform a proof by induction with increasing depth on the abstract model $A_n$, as shown in FIG. 12 (boxes 1200-1202). If the proof by induction succeeds (box 1203), then it is guaranteed to be true on the concrete design also. In many cases, a BMC Proof technique may be able to perform a deeper proof by induction on an abstract model, which may allow it to succeed. If the proof fails up to the maximum depth tried (box 1204), the verification is inconclusive.

(f) We use BDD-based [7, 8] or SAT+BDD-based [9] symbolic model checking methods on the abstract model $A_n$, as shown in FIG. 13 (boxes 1300-1302). If the correctness property is proved to be true (box 1303), it is guaranteed to be true on the concrete design as well. Due to the limited capacity of such methods, they are more likely to work on smaller abstract models. If the property fails, an abstract counterexample is found (box 1304), and we can handle it as described in 8(*b*).

Figure 14:
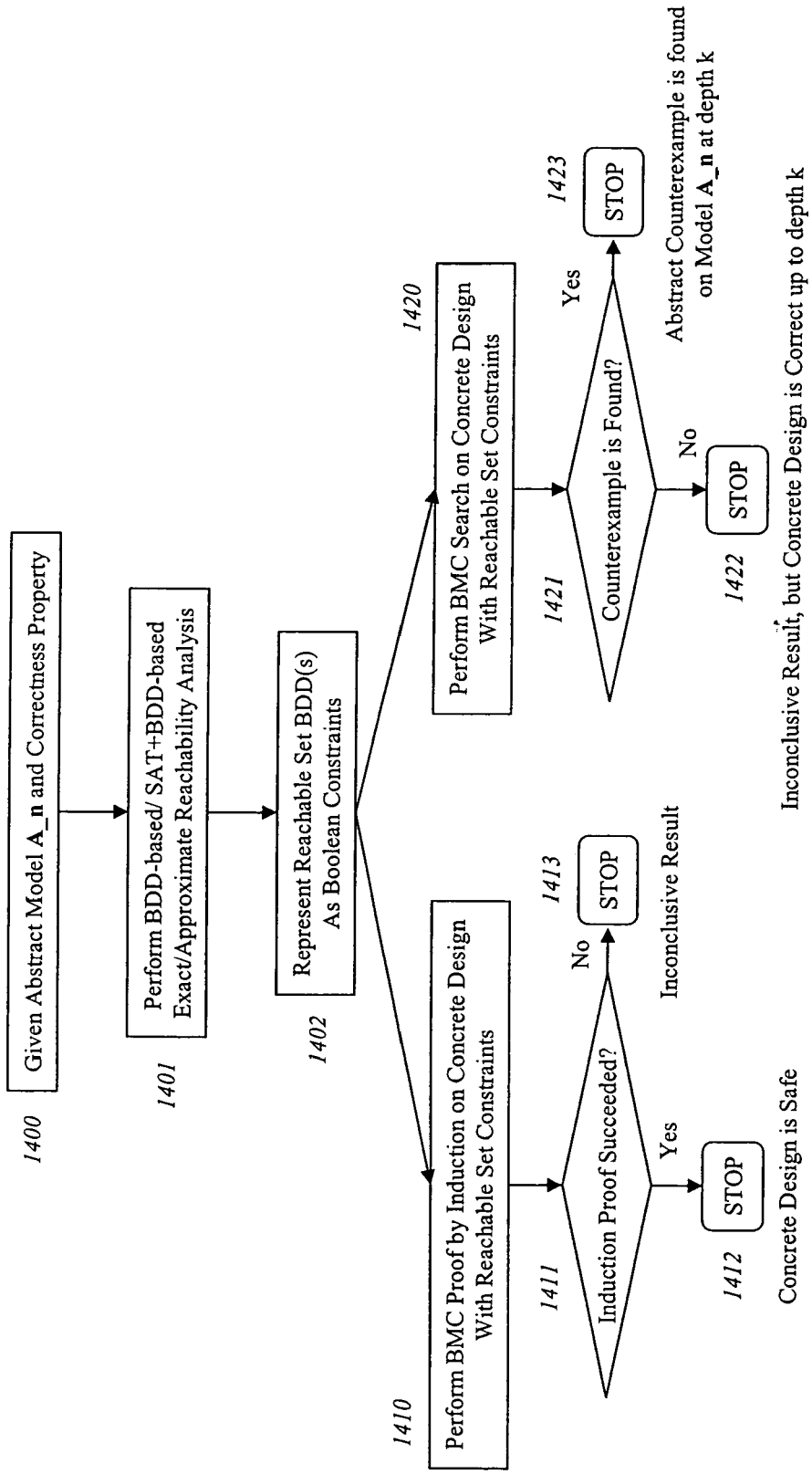
FIG. 14 is a block/flow diagram illustrating a BDD-based/BDD+SAT-based reachability analysis method.

(g) For safety properties, we use BDD-based [7, 8] or SAT+BDD-based [9] reachability analysis methods on an abstract model $A_n$ to constraint BMC Proof on the concrete design (or any abstract model larger than $A_n$), as shown in FIG. 14. Given an abstract model $A_n$ (box 1400), we use approximate or exact traversal methods to obtain BDDs that denote sets of reachable states at different depths (box 1401). These sets are over-approximations of reachable states in the concrete design. Next, we convert the reachable set BDDs into Boolean constraints (box 1402). Then we use BMC Proof technique [5] on the concrete design, where the reachable set constraint is used to constrain the arbitrary state in the inductive step (box 1410). If the proof by induction succeeds (box 1411), then it is guaranteed to be true on the concrete design also (box 1412). In many cases, the use of a BDD-based reachability invariant allows the induction proof to succeed. If the proof fails, verification is inconclusive (box 1413).

(h) We use BDD-based [7, 8] or SAT+BDD-based [9] reachability analysis methods on an abstract model $A_n$ to constrain BMC Search for counterexamples on the concrete design (or any abstract model larger than $A_n$), also shown in FIG. 14. The procedure for deriving the reachability constraints is the same as that described in 8(*g*) (boxes 1401, 1402). Then we use BMC Search, where reachability constraints provide additional constraints (box 1420). In practice, use of reachability constraints with BMC Search can help to perform deeper searches. If no counterexample is found (box 1421) up to depth k (box 1422), then the concrete design is guaranteed to be correct up to depth k. However, if a counterexample is found (box 1423), we handle it as described in 8(*b*).

E. LAZY CONSTRAINTS

In this section we describe lazy constraints, their use in BMC for proof-based abstraction, and experimental results to show their effectiveness.

1. Synopsis

Let BMC(k) denote the translation of the k-instance BMC problem into a Boolean formula. We regard BMC(k) to consist of the following sets of constraints:

Gate constraints for each gate in the unrolled design: these constraints model the gate functionality.

External constraints Ext(e) imposed on a node e in the unrolled design: arising due to the property translation, or imposed by the designers to model environment constraints.

Latch interface constraints IF(L,k): for each latch L in the transition relation of the design, there are k+1 constraints. Of these, k constraints correspond to equality of the latch output at depth i, with the latch input at depth i−1, for $1 \leq i \leq k$ (We use the term transition relation to denote the entire combinational logic of the design, including next-state logic for the latches, as well as output logic for nodes on which external constraints are imposed in the unrolled design).

We denote these as interface propagation constraints. In addition, there is one more constraint corresponding to equality of the latch output at depth 0, with the initial state value for that latch. We denote this as the initial state constraint.

For deriving a proof-based abstraction from a given unsatisfiable core C(k), consider a partitioning of the set of latches into the following subsets:

Sequential latches: for which at least one interface propagation constraint belongs to C(k)

Initial latches: for which only the initial state constraint belongs to C(k)

PPI latches: for which neither the initial state constraint, nor any of the interface propagation constraints belong to C(k).

Clearly, the set of PPI latches can be abstracted away, since they are not used at all in the proof of unsatisfiability. On the other hand, a sequential latch may need to be retained in the abstract model, since it is used to propagate a constraint across time frames for the derived proof. In a sense, the sequential latches are good candidates for defining an "invariant" abstract model. Finally, it is possible that an initial latch is not needed to obtain an "invariant"—its initial value may just happened to be used by the SAT solver to derive the proof.

We observed empirically that when BMC with proof analysis is used on concrete designs, many latches marked due to C(k) are initial latches. Rather than add these latches to an abstract model, our strategy is to guide the SAT solver to find a proof that would not use their initial state values unless needed. Note that, in general, it would not be possible to guarantee correctness up to depth k, if such latches were simply excluded from the abstract model. Lazy constraints provide a way to handle these initial latches.

2. Making Eager Constraints Lazy

When translating a BMC problem to a SAT problem, initial state values for all latches in a given design are typically added as 1-literal clauses to BMC(k). In a standard DPLL SAT solver [13], implications due to 1-literal clauses are performed as part of pre-processing (before any decisions are taken in the SAT search). Furthermore, these implications are recorded, and potentially used by the SAT solver for conflict analysis later, which may lead to these constraints belonging to the unsatisfiable core C(k). Our effort is targeted at depriving the SAT solver of immediate implications from (some of) these 1-literal clauses. Rather than change the standard BCP procedure, we achieve this effect by making an eager constraint lazy, i.e. by converting a 1-literal clause to a pair of 2-literal clauses as follows.

Consider a constraint that variable x should always have value 1, which can be enforced by using a 1-literal clause x. In order to make this constraint lazy, we introduce a dummy variable y, and replace the 1-literal clause by the pair of clauses (x+y)(x+y'). Note that if the dummy variable y is never chosen as a decision variable by the SAT solver (e.g. by giving it an arbitrary low score), then these clauses will not imply any value on x. However, if the SAT solver implies a value 1 on x due to other constraints, then both these clauses are satisfied. More interestingly, if the SAT solver implies a value 0 on x, these clauses will immediately cause a conflict on y, thereby ensuring that the constraint on x is respected. (In some cases, the 1-literal clause on x may even be learned by conflict analysis.)

This general idea of delaying implications by adding dummy variables can be applied to multi-literal clauses as well. For example, in the BMC application, 2-literal clauses are used as interface propagation constraints, to enforce the equality of latch inputs and outputs across time frames. However, we have currently not explored this much, since there is no specific point in the SAT procedure When implications due to the original multi-literal clauses are performed.

3. Use of Lazy Constraints in BMC

The essential idea of delaying implications is applicable in many different ways in BMC. Indeed, by converting the initial state constraints for all latches in the design to lazy constraints, one can hope to quickly find an "invariant" abstract model, which does not rely upon the initial state information unless needed. However, in general, delaying implications by using lazy constraints may result in a performance penalty, since the efficiency of a SAT solver depends crucially on performing more implications in order to avoid search.

Keeping in mind the tradeoff between lazy constraints and performance, we use the following different methods for using lazy constraints in BMC:

Method 1: For iterative abstraction, we generate an abstract model for the next iteration by not including any initial latch marked by C(k), thereby reducing its size. However, lazy constraints for their initial state values are added to the BMC problems in the next iteration, in order to ensure correctness up to depth k. Note that in this method, the lazy constraints are applied to PPIs of the reduced abstract model. Therefore, we call this the Lazy PPI Constraint approach.

Method 2: We use lazy constraints for initial state values for at least one latch (or all latches) in a given design. We call this the Lazy Latch Constraint (LLC) approach. Furthermore, we distinguish between the $1^{st}$ iteration of an iterative abstraction framework, where BMC is applied on a typically large design, from higher iterations where BMC is typically applied on smaller abstract models. On this basis, we can apply lazy latch constraints in (i) no iterations, (ii) in only the higher iterations, or (iii) in all iterations.

Method 3: We can also use lazy constraints to model external environment constraints, typically provided by the designer. We call this the lazy external constraint approach. The benefit, again, is that by delaying implications from these constraints, one can hope to identify a smaller set that is sufficient for proving unsatisfiability. This information can be used to generate smaller abstract models, both for iterative abstraction, and for final verification. In practice, we use it mainly for the latter application, since using a partial set of external constraints during iterative abstraction may result in spurious counterexamples, which require special handling (either by searching deeper using BMC, or by refinement).

F. EXPERIMENTAL RESULTS

We have implemented the iterative abstraction framework in a prototype verification platform called DiVer [16]. The BMC engine in DiVer has been successfully used for verification of many large industry designs. For our experiments here, we chose the most difficult of these designs, ranging in size up to 416 k gates and 12 k flip-flops in the static cone of influence. We verified safety properties, i.e. the BMC search was for simple counterexamples without loops. All experiments were performed on a 2.2 GHz Dual Xeon processor machine, with 4 GB memory, running Linux 7.2.

1. Results for Iterative Abstraction

The results for use of iterative abstraction are summarized in Table 1. The size of the concrete design is listed in Column 2 in terms of number of flip-flops (#FF), and number of gates (#Gates). The results for the different iterations are shown in the remaining columns, where for each iteration, we report the size of the abstract model (#FF, number of flip-flops), the depth at which it was derived (k), and the total CPU time taken by BMC with Proof Analysis to check up to that depth (T(s), in seconds).

Typically, we used a 3-hour time limit for each iteration. Within each iteration, we used either the last depth completed by BMC, or a simple heuristic to pick the depth, from which to generate the seed model for the next iteration. The heuristic we used was to look for a stable set AR(k) which did not change for 10 time frames. For these experiments, we used the cheaper latch interface abstraction, which skips the recursive DFS traversal. Also, we iterated over the inner loop till the size of the seed model converged.

Note that the first iteration was quite successful in generating small abstract models. For most designs, we obtained a magnitude of order reduction, in comparison to the size of the concrete design. Typically, the first iteration was also the most expensive in CPU time. Next, note that for some designs, we can clearly see a reduction across the iterations also. In particular, for the design D1, iterative abstraction allowed the size of the

TABLE 1

Results for Iterative Abstraction

| Concrete Design #FF/#Gates | Abstract Models Generated by Iterative Abstraction | | | | | | | | | | | | | | | | | | | | |
|---|---|---|---|---|---|---|---|---|---|---|---|---|---|---|---|---|---|---|---|---|---|
| | Iteration 1 | | | Iteration 2 | | | Iteration 3 | | | Iteration 4 | | | Iteration 5 | | | Iteration 6 | | | Iteration 7 | | |
| | #FF | k | T(s) | #FF | k | T(s) | #FF | k | T(s) | #FF | k | T(s) | #FF | k | T(s) | #FF | k | T(s) | #FF | k | T(s) |
| D1 12.7k/416.1k | 1269 | 63 | 32815 | 541 | 63 | 486 | 439 | 63 | 140 | 259 | 63 | 75 | 212 | 63 | 34 | 118 | 61 | 20 | 113 | 60 | 5 |
| D2 4.2k/37.8k | 523 | 47 | 10043 | 451 | 56 | 2540 | 445 | 41 | 4163 | 444 | 43 | 2293 | | | | | | | | | |
| D3 5.2k/46.4k | 1530 | 30 | 10515 | 1468 | 28 | 2763 | 1434 | 29 | 4354 | 1406 | 27 | 6812 | 1356 | 28 | 8650 | | | | | | |
| D4 910/18k | 476 | 80 | 6274 | 420 | 78 | 3250 | 405 | 80 | 8765 | 397 | 85 | 9588 | 396 | 78 | 2660 | | | | | | |
| D5 4.2k/37.8k | 330 | 43 | 882 | 303 | 34 | 27 | | | | | | | | | | | | | | | |
| D6 3.6k/155k | 105 | 15 | 1786 | 103 | 15 | 7 | | | | | | | | | | | | | | | | abstract model to be reduced from 1269 (Iteration 1) to 113 (Iteration 7) flip-flops. Though other designs did not exhibit the same level of reduction, we did manage to reduce their sizes as well.

This effect is related to that observed by others, i.e. when proof analysis techniques are applied iteratively, the final unsatisfiable core can be much smaller than the original problem [10]. However, note that we are not applying the iterative technique to the unsatisfiable core at each depth. We are choosing the core at a particular depth, and applying proof analysis on the resulting abstract model at all depths in the next iteration. We are currently experimenting with combining the two, to see if we can reduce the sizes of the abstract models even further.

2. Results for Verification of Abstract Models

After we performed iterative abstraction, we tried verification of the generated abstract models. These results are summarized in Table 2, and discussed in more detail in this section.

(Depth), and the total CPU time taken for searching all depths up to the maximum (T(s), in seconds). Note that our basic BMC engine is able to search fairly deep even for large designs. However, we were unable to find a counterexample for any of these designs.

The next set of columns shows results for basic BMC on an abstract seed model generated during iterative abstraction. Again, we report the size of the abstract model (#FF/#Gates), the maximum depth searched by BMC (Depth), and the total CPU time taken to search up to that depth (T(s), in seconds). For all designs except D3, we were able to search deeper on the abstract models than on the concrete designs. For some, there was an increase by an order of magnitude in the maximum depth searched. This is due to an improvement in the SAT checking time on smaller problems, and the ability to unroll the model deeper with bounded memory resources. Since no counterexample were still found, these results constituted at least an increased level of confidence in the correctness.

TABLE 2

Results for Verification of Concrete and Abstract Models

| | Concrete Design Basic BMC Performance | | | Abstract Model Basic BMC Performance | | | Proof of Property Using Abstract Model | | |
|---|---|---|---|---|---|---|---|---|---|
| | #FF/#Gates | Depth | T(s) | #FF/#Gates | Depth | T(s) | Status | T(s) | Verification Method |
| D1 | 12.7k/416.1k | 96 | 10230 | 113/1.5k | 1012 | 10788 | Yes | 40 | BDD-based model checking |
| D2 | 4.2k/37.8k | 64 | 7519 | 451/14.5k | 115 | 7129 | No | | |
| D3 | 5.2k/46.4k | 32 | 8667 | 1356/20.8k | 30 | 7513 | No | | |
| D4 | 910/18k | 89 | 9760 | 396/6k | 96 | 10134 | No | | |
| D5 | 4.2k/37.8k | 82 | 3968 | 303/12.4k | 211 | 10603 | Yes | 2* | BDD Constraints for BMC-based Induction |
| D6 | 3.6k/155k | 307 | 3099** | 103/17.3k | 3034 | 2635** | Yes | 2738 | BDD Constraints for BMC-based Induction |

(Notes
*BDD analysis performed on a different abstract model, with 40 FF, derived from depth 4.
**mem-out within 3-hour time limit.)

For each design, we ran basic BMC with a 3-hour time limit, and these results are shown in the first set of columns. We report the size of the concrete design (#FF/#Gates), the maximum depth for which BMC search was completed The last set of columns report the results for complete verification of the abstract models. We report the status of the verification (Status), i.e. whether or not we were able to prove the property correct. Note that we were able to prove the correctness of 3 of the 6 designs. For successful instances, we also report the time taken (T(s), in seconds) and the verification method used.

For design D1, we were able to prove the property correct on the abstract model in 40 seconds, by using standard BDD-based symbolic model checking. In fact, we had not been able to prove this design correct using any other techniques so far. For design D5, we were given external constraints by the designers, which needed to be enforced at every cycle. However, these constraints were not enough to help a proof by induction. Therefore, we performed a BDD-based reachability analysis on a much smaller abstract model derived from depth 4, with 40 flip-flops, which took 1 second. The computed reachable state set was used as a reachability invariant by the BMC engine [18], to successfully perform a proof by induction on the concrete design, in less than 1 second. Similarly, for design D6 also, we performed a reachability analysis on the shown model with 103 flip-flops, taking 2737 seconds. Again, with the BDD-based reachability invariant, our BMC engine was able to successfully prove the property on the concrete design in less than 1 second. So far, we have not been able to conclusively verify the remaining designs D2, D3, and D4. We are currently experimenting with abstract models generated from lower depths, and hope to obtain further improvement.

3. Experimental Results for Lazy Constraints

We have implemented the use of lazy constraints as part of the iterative abstraction framework using SAT-based BMC in DiVer [16]. In this section we describe our experimental results that show their effectiveness in generating smaller abstract models.

The experimental setup consists of an iterative abstraction framework, where each iteration consists of applying BMC with proof analysis on a given model for increasing depth k. Within each iteration, we generate an abstract model for the next iteration whenever the unsatisfiable core C(k) is stable (does not change) for at least 10 time frames. In cases where C(k) does not become stable, we generate a new abstract model for the last depth completed by BMC within a time limit of 3 hours.

For our experiments, we used several industry designs, ranging in size up to 416 k gates and 12 k flip-flops in the cone of influence of the correctness property. We verified safety properties, i.e. the search was for simple counterexamples without loops. All experiments were performed on a 2.8 GHz Xeon processor machine, with 4 GB memory, running Linux 7.2.

a) Comparison of Abstract Model Sizes

We performed detailed experiments for the following four combinations of use of lazy constraints:

No Lazy PPI Constraints, No Lazy Latch Constraints: This combination can be used as a baseline comparison for evaluating the effectiveness of using lazy constraints.

The remaining three combinations all use Lazy PPI Constraints. They differ in whether the Lazy Latch Constraints (LLC) are used in none, only the higher than first, or all iterations of the iterative abstraction framework.

TABLE 3

Results for Use of Lazy Constraints

Final Abstract Model Generated by Iterative Abstraction

| | Concrete Model | | No Lazy PPI Constraints No LLC | | | With Lazy PPI Constraints (Method 1) | | | | | | | | |
|---|---|---|---|---|---|---|---|---|---|---|---|---|---|---|
| | | | | | | No LLC | | | LLC in Higher Iterations | | | LLC in All Iterations | | |
| Design | # FF | # Gates | # FF | # Iter | Time (s.) | # FF | # Iter | Time (s.) | # FF | # Iter | Time (s.) | # FF | # Iter | Time (s.) |
| D1 | 3378 | 28384 | 522 | 9 | 60476 | 516 | 9 | 50754 | 294 | 4 | 11817 | 294 | 4 | 8993 |
| D2 | 4367 | 36471 | 1223 | 8 | 80630 | 1233 | 5 | 39573 | 1119 | 9 | 64361 | 1136 | 9 | 70029 |
| D3 | 910 | 13997 | 433 | 5 | 11156 | 355 | 9 | 32520 | 166 | 10 | 29249 | 196 | 6 | 32291 |
| D4 | 12716 | 416182 | 369 | 4 | 1099 | 71 | 6 | 1203 | 71 | 6 | 1310 | | | TO* |
| D5 | 2714 | 77220 | 187 | 2 | 17 | 3 | 5 | 22 | 3 | 3 | 21 | 3 | 2 | 17 |
| D6 | 1635 | 26059 | 228 | 6 | 5958 | 225 | 4 | 5324 | 148 | 3 | 4102 | 146 | 2 | 7 |
| D7 | 1635 | 26084 | 244 | 3 | 3028 | 240 | 2 | 3039 | 155 | 5 | 2768 | 146 | 2 | 85 |
| D8 | 1670 | 26729 | 149 | 3 | 25 | 149 | 3 | 28 | 148 | 3 | 28 | 148 | 2 | 41 |
| D9 | 1670 | 26729 | 162 | 3 | 40 | 162 | 3 | 43 | 147 | 3 | 44 | 149 | 3 | 43 |
| D10 | 1635 | 26064 | 159 | 2 | 12 | 158 | 3 | 29 | 146 | 3 | 30 | 145 | 2 | 6 |
| D11 | 1670 | 26729 | 149 | 3 | 25 | 149 | 3 | 28 | 148 | 3 | 28 | 148 | 2 | 40 |
| D12 | 1670 | 26729 | 183 | 4 | 2119 | 182 | 4 | 2316 | 182 | 4 | 2376 | 180 | 2 | 653 |
| D13 | 1670 | 26729 | 180 | 2 | 63 | 179 | 2 | 68 | 154 | 3 | 71 | 174 | 3 | 61 |
| D14 | 1635 | 26085 | 190 | 3 | 1352 | 192 | 3 | 1515 | 154 | 5 | 1480 | 142 | 3 | 10 |
| D15 | 1635 | 26060 | 153 | 3 | 125 | 153 | 3 | 149 | 153 | 3 | 142 | 151 | 3 | 73 |

Notes:
1. LLC denotes use of Lazy Latch Constraints (Method 2)
2. TO* indicates a timeout in the first iteration, without generating a useful abstract model The results are shown in Table 3. The design name, along with number of flip-flops and gates in the cone-of-influence of the property are shown in Columns 1-3, respectively. (The designs D6-D15 are actually different properties specified on the same block.) The remaining columns compare sizes of the abstract models and performance for the four different combinations described above. For each combination, we report the number of flip-flops in the final abstract model after convergence (#FF), the number of iterations needed to achieve convergence (#Iter), and the total CPU time for all iterations, including generation of the abstract models (Time, in seconds).

Note first that using Lazy PPI Constraints alone reduces size of the abstract models in all examples except one. Note also that once the Lazy PPI Constraints are added, the sizes are reduced even further by additional use of Lazy Latch Constraints (LLC). Indeed, for all examples, using some combination of both resulted in the smallest abstract model. As shown, a reduction by a factor of 2 is quite typical, with greater reductions in some isolated cases (D5). Furthermore, the number of iterations to achieve convergence is always less when LLC are used. This confirms our intuition that the SAT solver converges more "quickly" on a stable invariant, when less affected by eager implications due to the initial state constraints.

In terms of a preference between using LLC in higher iterations only, versus using LLC in all iterations, the data are somewhat unclear. Though the sizes of the abstract models are not very different for most designs, there seems to be a bigger difference in performance. However, neither of these performs consistently better than the other. In particular, for design D4, use of LLC in the first iteration did not work well at all. This is likely due to the fact that in large designs, such as D4, eager implications from initial state values provide crucial pruning of the search space. On the other hand, for design D14, use of LLC in all iterations reduced the runtime by 2 orders of magnitude. In general, we prefer to use LLC only in the higher iterations, in order to provide robustness on large designs.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

We claim:

1. A computer implemented method for verification of a given correctness property on a sequential circuit design by using a satisfiability-based check for bounded model checking, comprising:
   (a) if the given correctness property is proved correct at a depth k, marking only flip-flops and external constraint nodes in the circuit design, based on whether their constraints appear in an unsatisfiable core generated from a proof of unsatisfiability by a satisfiability solver; otherwise, terminating verification,
   (b) deriving an abstract model consisting of combinational fanin cones of the marked flip-flops and external constraint nodes,
   (c) checking the given correctness property on the derived abstract model, and
       if the derived abstract model is proved correct, terminating the verification and deeming the circuit design to be correct.
       otherwise, increasing the depth of unrolling k and repeating steps (a)-(c) until either the given correctness property is violated at some depth or the circuit design is determined to be correct.

2. The method of claim 1, wherein in step (a)
   a flip-flop is marked, if any of its latch interface constraints belong to the said unsatisfiable core, and
   a flip-flop is marked, if its initial state value constraint belongs to the said unsatisfiable core.

3. The method of claim 1, wherein in step (a)
   a flip-flop is marked, if any of its latch interface constraints belong to the said unsatisfiable core, and
   a flip-flop is unmarked if only its initial state value constraint belongs to the said unsatisfiable core.

4. The method of claim 1, wherein during the bounded model checking
   a modified initial value constraint is used for flip-flop, with an initial value constraint m being replaced by (m+y)(m+y'), where y is a fresh variable not used in rest of the satisfiability-based check.

5. The method of claim 1, wherein during the bounded model checking
   a modified constraint is used for an external constraint node, with an environmental constraint (m) being replaced by (m+y)(m+y'), where y is fresh variable not used in rest of the satisfiability-based check.

6. The method of claim 1, where the size of the derived abstract model corresponds to the number of flip-flops in the derived abstract model.

7. A computer implemented method for verification of a given correctness property on a sequential circuit design, comprising the steps:
   (a) if the property is violated at depth k using a satisfiability-based bounded model checking, terminating the verification,
   (b) if the property is proved correct at depth k using a satisfiability-based bounded model checking, deriving an abstract model $A_n$ from a proof of unsatisfiability generated by the satisfiability solver,
   (c) increasing the depth of unrolling k in bounded model checking,
   (d) repeating steps (a-c), constituting an inner loop comprising the bounded model checking iterations, until either there is no change in the size of the derived abstract model as the depth of unrolling k is increased, or some limit kmax on k is reached,
   (e) repeating steps (a-d) by using bounded model checking on the derived abstract model $A_n$ to derive a new abstract model $A_{n+1}$, these steps constituting an outer loop comprising the abstraction iterations, until either there is no change in the size of the derived abstract model or some limit on number of abstraction iterations is reached,
   (f) checking the given correctness property on the derived abstract model, and if the derived abstract model is proved correct, deeming the circuit design to be correct; otherwise, deeming the verification to be inconclusive.

* * * * *